(12) United States Patent
Moon

(10) Patent No.: US 12,532,783 B2
(45) Date of Patent: Jan. 20, 2026

(54) METHOD OF MANUFACTURING A SEMICONDUCTOR CHIP INCLUDING A STRESS CONCENTRATION PORTION

(71) Applicant: SK hynix Inc., Icheon-si (KR)

(72) Inventor: Woo Sung Moon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 728 days.

(21) Appl. No.: 17/978,846

(22) Filed: Nov. 1, 2022

(65) Prior Publication Data

US 2023/0369290 A1    Nov. 16, 2023

(30) Foreign Application Priority Data

May 13, 2022    (KR) .......................... 10-2022-0059204

(51) Int. Cl.
*H01L 25/065* (2023.01)
*H01L 23/00* (2006.01)

(52) U.S. Cl.
CPC ........ *H01L 25/0657* (2013.01); *H01L 23/562* (2013.01); *H01L 24/16* (2013.01); *H01L 2924/15311* (2013.01); *H01L 2924/3512* (2013.01)

(58) Field of Classification Search
None
See application file for complete search history.

(56) References Cited

U.S. PATENT DOCUMENTS

| | | | | |
|---|---|---|---|---|
| 5,885,857 | A | * 3/1999 | Yamaha | ................ H01L 23/562 |
| | | | | 438/599 |
| 6,300,223 | B1 | * 10/2001 | Chang | ..................... H01L 21/78 |
| | | | | 438/114 |
| 2003/0122220 | A1 | * 7/2003 | West | ..................... H01L 23/585 |
| | | | | 257/E23.194 |

FOREIGN PATENT DOCUMENTS

KR    1020180010426 A    1/2018

* cited by examiner

*Primary Examiner* — Hung K Vu
(74) *Attorney, Agent, or Firm* — WILLIAM PARK AND ASSOCIATES LTD.

(57) ABSTRACT

A method of manufacturing a semiconductor chip includes forming a first stack by alternately stacking first material layers and second material layers over a semiconductor substrate, forming a first trench penetrating the first stack, and forming a first stress concentration portion by forming a second stack over the first stack.

25 Claims, 34 Drawing Sheets

METHOD OF MANUFACTURING A SEMICONDUCTOR CHIP INCLUDING A STRESS CONCENTRATION PORTION

CROSS-REFERENCE TO RELATED APPLICATIONS

The present application claims priority under 35 U.S.C. 119(a) to Korean Application No. 10-2022-0059204, filed on May 13, 2022, in the Korean Intellectual Property Office, which is incorporated herein by reference in its entirety.

BACKGROUND

1. Technical Field

The present disclosure generally relates to a semiconductor technology and, more particularly, to a method of manufacturing a semiconductor chip including a stress concentration portion that guides crack-propagation.

2. Related Art

Semiconductor devices are integrated on a substrate such as a wafer. Attempts have been made to three-dimensionally integrate semiconductor devices on a substrate. In order to increase the degree of integration of memory cells, three-dimensional semiconductor devices have been tried. By dicing the substrate on which the semiconductor devices are integrated, a plurality of semiconductor chips including the semiconductor devices may be separated from the substrate. The semiconductor chips may be damaged while dicing the substrate. In order to reduce the damage of the semiconductor chips, various types of dicing process techniques have been tried. Dicing processes using a laser have been tried.

SUMMARY

An embodiment of the present disclosure may provide a method of manufacturing a semiconductor chip including forming a first stack by alternately stacking first material layers and second material layers on a semiconductor substrate, forming a first trench penetrating the first stack, and forming a first stress concentration portion by forming a second stack on the first stack, the first stress concentration portion comprises the first trench and a bent portion of the second stack.

Another embodiment of the present disclosure may provide a method of manufacturing a semiconductor chip including forming a first stack by alternately stacking first material layers and second material layers on a semiconductor substrate including a scribe lane region and a chip region, forming a first trench formed to overlap with the scribe lane region of the semiconductor substrate and a third trench formed to overlap with the chip region of the semiconductor substrate to penetrate the first stack, forming an insulating pattern filling the third trench, and forming a second stack on the first stack and forming a first stress concentration portion including a bent portion of the second stack and the first trench.

DETAILED DESCRIPTION

Figure 1:
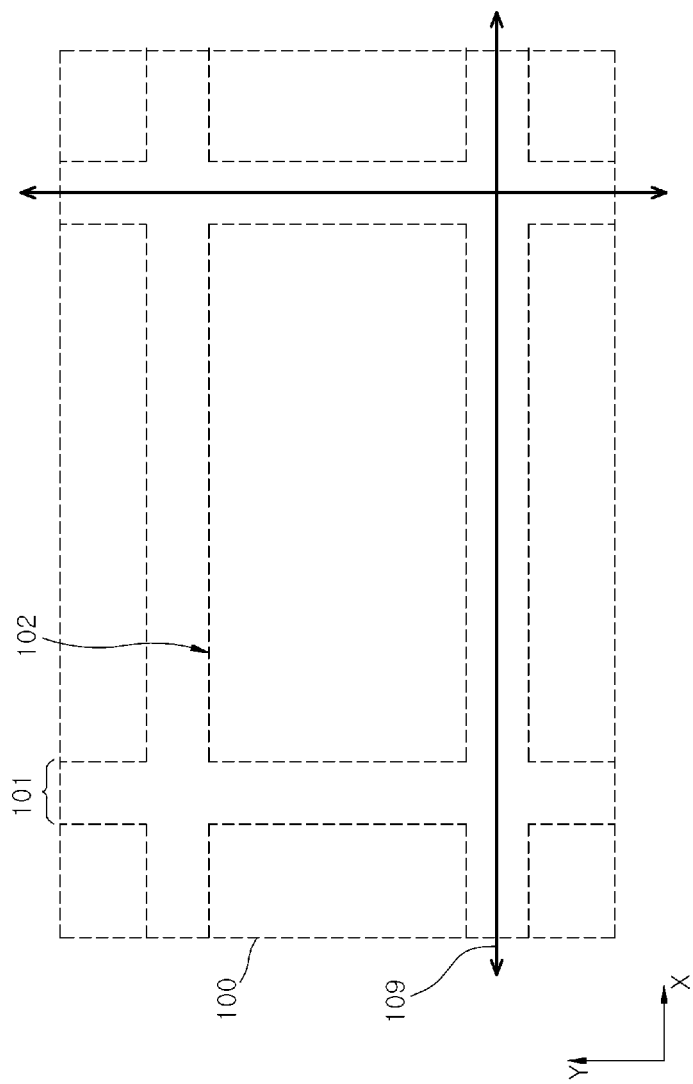
FIGS. 1 to 13 are schematic views illustrating a method of manufacturing a semiconductor chip according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," "bottom or lower" may be used herein to describe various devices, these devices should not be limited by these terms. These terms are only used to distinguish one device from another device, but not used to indicate a particular sequence or number of devices.

Semiconductor substrates may refer to semiconductor wafers on which electronic components and elements are integrated. Integrated circuits may be integrated into the semiconductor substrate. The semiconductor substrate may be diced into a plurality of semiconductor chips or a plurality of semiconductor dies.

The semiconductor chip may indicate memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (Aps), graphic processing units (GPUs), central processing units (CPUs) or system-on-chips (SoCs).

The semiconductor chip may be an element constituting a semiconductor package or a semiconductor product. The semiconductor chips may be employed in information communication systems such as mobile phones, electronic systems associated with biotechnology or health care, or wearable electronic systems. The semiconductor chips may be applicable to internet of things (IoT).

Same reference numerals may refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIGS. 1 to 13 are schematic views illustrating a method of manufacturing a semiconductor chip according to an embodiment of the present disclosure. FIG. 1 is a schematic plan view illustrating an arrangement of regions 101 and 102 of a semiconductor substrate 100 in the method of manufacturing a semiconductor chip according to the embodiment of the present disclosure.

Referring to FIG. 1, the method of manufacturing a semiconductor chip according to the embodiment may include a process of cutting or dicing the semiconductor substrate 100 to separate the semiconductor substrate 100 into individual semiconductor chips. The semiconductor substrate 100 may have a shape of a semiconductor wafer. Integrated circuits such as memory devices or semiconductor devices may be integrated in or on the semiconductor substrate 100. The semiconductor substrate 100 may include a semiconductor material layer such as a silicon (Si) layer.

The semiconductor substrate 100 may include a scribe lane region 101 and chip regions 102. The scribe lane region 101 may be a region located between one chip region 102 and another neighboring chip region 102. The scribe lane region 101 may be a region enclosing each chip region 102 to partition the chip regions 102. The chip regions 102 may be regions in which semiconductor devices are integrated or located. The chip regions 102 may be regions that will be separated into individual semiconductor chips.

Some portions of the scribe lane region 101 may be regions that extend in the X-axis direction on the X-Y plane, and other portions may be regions that extend in the Y-axis direction on the X-Y plane. The scribe lane region 101 may be a region that crosses the X-axis direction and the Y-axis direction. The scribe lane region 101 may be a region for cutting or dicing the semiconductor substrate 100 in order to separate the semiconductor substrate 100 into individual semiconductor chips. Dicing lines 109 in the X-axis direction and the Y-axis direction may be set along the scribe lane region 101, and the semiconductor substrate 100 may be diced along the dicing lines 109. Accordingly, the semiconductor substrate 100 may be diced into individual semiconductor chips. Each of the semiconductor chips may be separated from the semiconductor substrate 100 to include the chip region 102.

The process of separating the semiconductor substrate 100 into the semiconductor chips may include a wafer dicing process using a laser. The wafer dicing process may include process steps of sequentially and repeatedly irradiating a laser to some portions of the semiconductor substrate 100 corresponding to the scribe lane region 101, and forming an arrangement of modified patterns or a layer of modified patterns in the semiconductor substrate 100 by the laser irradiation. The modified patterns may be formed in the semiconductor substrate 100 corresponding to the scribe lane region 101, and cracks may be grown or propagated from the modified patterns by expanding the semiconductor substrate 100 in the X-axis direction and the Y-axis direction. As the cracks are propagated from the modified patterns, the cracks may dice the semiconductor substrate 100, thereby dicing the semiconductor substrate 100 into the semiconductor chips. Such a wafer dicing process may be a stealth dicing process. The method of manufacturing a semiconductor chip according to the embodiment of the present disclosure may dice the semiconductor substrate into semiconductor chips by applying the stealth dicing process.

Figure 2:
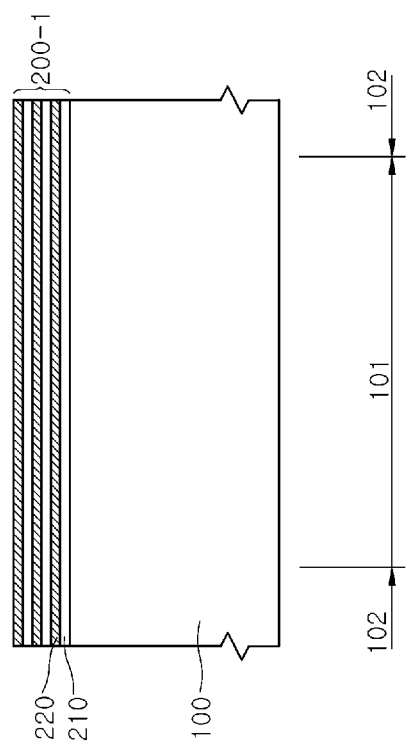

FIG. 2 is a schematic cross-sectional view illustrating a step of forming a first stack 200-1 in the method of manufacturing a semiconductor chip according to the embodiment of the present disclosure. FIG. 2 may show the cross-sectional shape that crosses the scribe lane region 101 of the semiconductor substrate 100 of FIG. 1.

Referring to FIG. 2, the first stack 200-1 may be formed on the scribe lane region 101 of the semiconductor substrate 100. The first stack 200-1 may be formed on the scribe lane region 101 and may extend on some portions of the chip regions 102. The first stack 200-1 may be formed by alternately and repeatedly stacking different material layers 210 and 220. The first material layer 210 and the second material layer 220 may be alternately and repeatedly stacked to form the first stack 200-1. The first stack 200-1 may be formed by stacking the material layers 210 and 220 in several stages. The first stack 200-1 may include, for example, the material layers 210 and 220 stacked in six stages. Each of the first material layers 210 and the second material layers 220 may be stacked in three stages. In FIG. 2, the first stack 220-1 is depicted as including the material layers 210 and 220 that are alternately stacked in six stages, but the material layers 210 and 220 may be stacked in fewer stages, or the material layers 210 and 220 may be alternately stacked in more stages.

The first material layer 210 and the second material layer 220 may be formed of different insulating materials. For example, the first material layer 210 may include silicon oxide ($SiO_2$), and the second material layer 220 may include silicon nitride ($Si_3N_4$). The first material layer 210 may be deposited on the semiconductor substrate 100, and the second material layer 220 may be deposited on the first material layer 210. The first stack 200-1 may be formed by repeating the process steps of depositing the first material layer 210 and the second material layer 220.

Although the first stack 200-1 is depicted as directly in contact with the semiconductor substrate 100 in FIG. 2, other layers may be further interposed between the first stack 200-1 and the semiconductor substrate 100.

Figure 3:
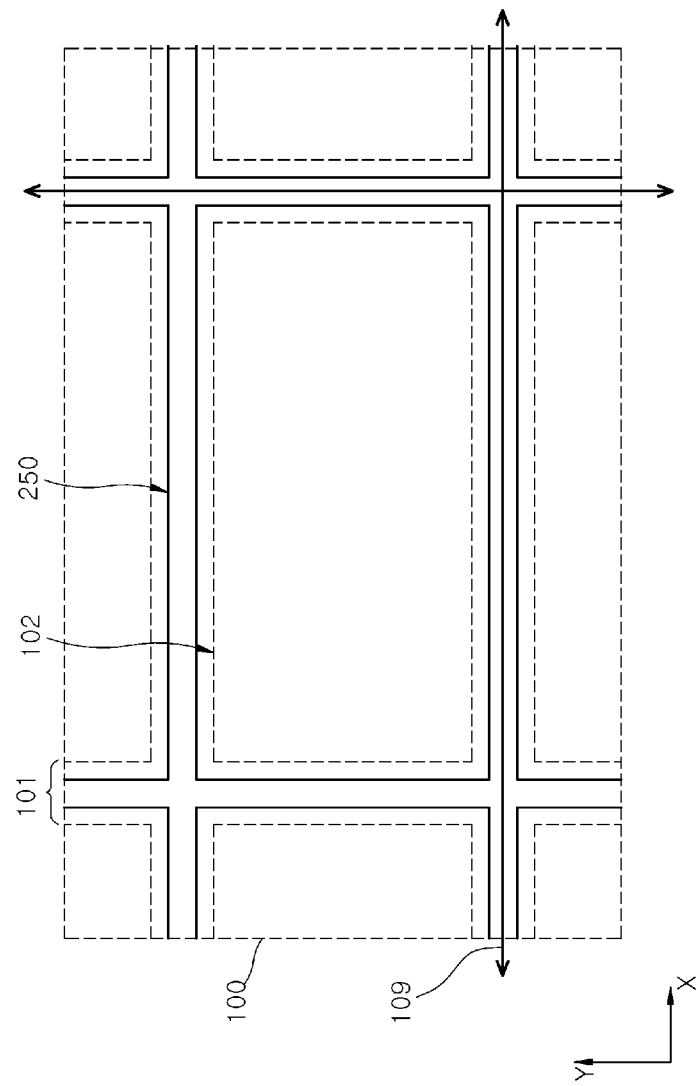
Figure 4:
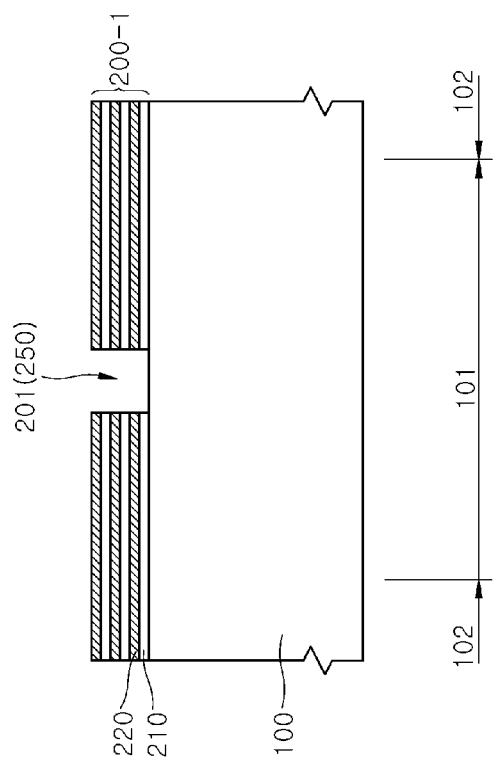

FIG. 3 is a schematic plane view illustrating a shape in which a first stress concentration portion 250 is disposed in the semiconductor substrate 100 in the method of manufacturing a semiconductor chip according to an embodiment of the present disclosure. FIG. 4 is a schematic cross-sectional view illustrating a step of forming a first trench 201 in the first stack 200-1 in the method of manufacturing a semiconductor chip according to an embodiment of the present disclosure. FIG. 4 may show the cross-sectional shape that crosses the scribe lane region 101 of the semiconductor substrate 100 of FIG. 3.

Referring to FIGS. 3 and 4, the first trench 201 that will constitute the first stress concentration portion 250 may be formed in the first stack 200-1 of the semiconductor substrate 100. The first trench 201 may be formed to penetrate the first stack 200-1. Some portions of the first stack 200-1 may be selectively etched and removed to form the first trench 201. As the first trench 201 is formed, the first stack 200-1 may be divided into two portions that are separated left and right of the first trench 201. The first trench 201 may divide and separate the second material layer 220 into two portions. The first trench 201 may be located over the scribe lane region 101 of the semiconductor substrate 100. The first trench 201 may extend long along the scribe lane region 101 of the semiconductor substrate 100.

Figure 5:
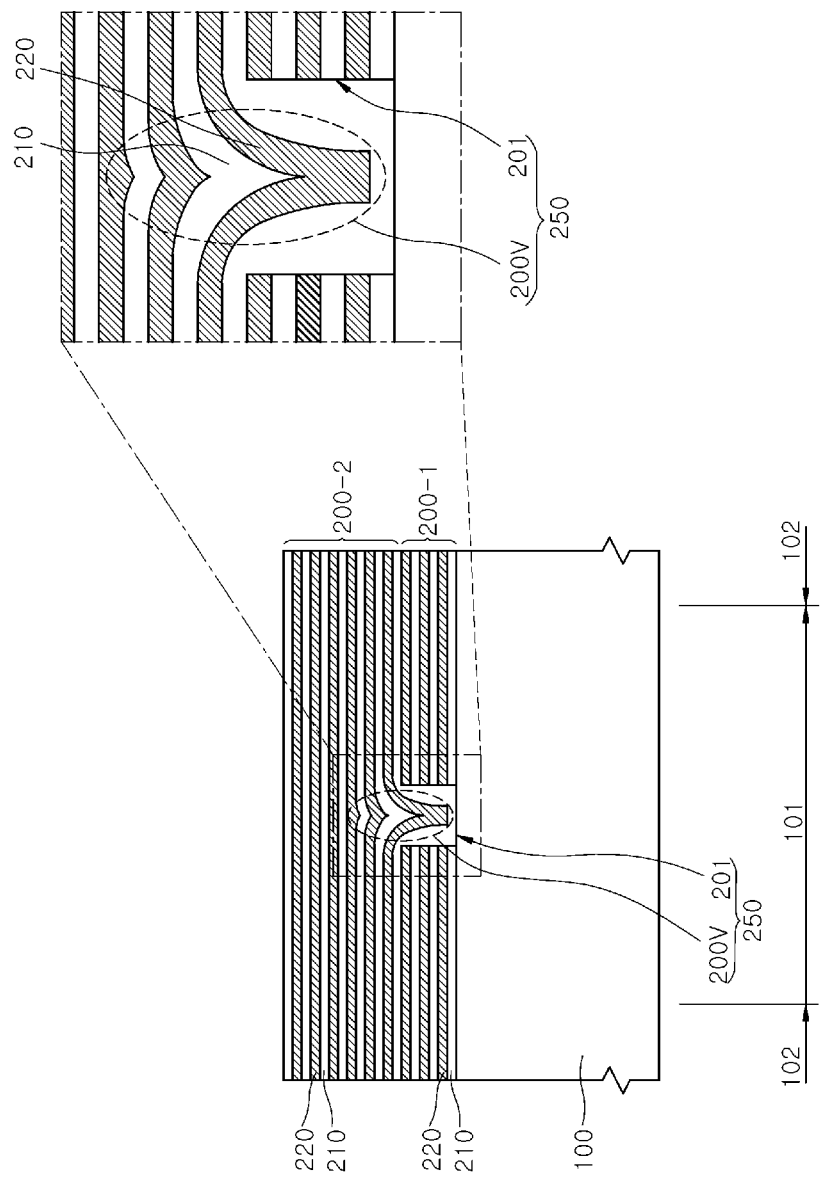

FIG. 5 is a schematic cross-sectional view illustrating a step of forming a second stack 200-2 and the first stress concentration portion 250 in the method of manufacturing a semiconductor chip according to an embodiment of the present disclosure. FIG. 5 may show the cross-sectional shape that crosses the scribe lane region 101 of the semiconductor substrate 100 of FIG. 3.

Referring to FIGS. 3 and 5, the second stack 200-2 may be formed on the first stack 200-1. The second stack 200-2 may be formed by further stacking the material layers 210 and 220 on the first stack 200-1. For example, the second stack 200-2 may be formed by alternately stacking the first material layer 210 and the second material layer 220 on the first stack 200-1. The second stack 200-2 may have a greater number of stages of the material layers 210 and 220 than the first stack 200-1. The second stack 200-2 may include several tens of the material layers 210 and 220. In another embodiment, the second stack 200-2 may be formed by alternately stacking third and fourth material layers of insulating materials other than the first material layer 210 and the second material layer 220.

As the second stack 200-2 is formed, a portion of the second stack 200-2 may extend into the first trench 201 and be bent to form a bent portion 200V. Due to the step structure or step shape caused by the first trench 201, the bent portion 200V of the second stack 200-2 may be formed to be bent into the first trench 201. A lower portion of the second stack 200-2 relatively closer to the first stack 200-1 or portions of the first and second material layers 210 and 220 located in the lower portion may fill the first trench 201 and may extend and be bent into the first trench 201. When the lower portion of the second stack 200-2 fills the first trench 201, the upper portion of the second stack 200-2 located relatively farther from the first stack 200-1 might not show a bent shape.

The structure including the bent portion 200V of the second stack 200-2 and the first trench 201 may constitute the first stress concentration portion 250. The first stress concentration portion 250 may provide a structure on which stress may be concentrated, compared to other portions of the semiconductor substrate 100 or layer stacks 200-1 and 200-2. Because the continuousness of the shape of the first stack 200-1 is cut off in the bent portion 200V of the first trench 201 and the second stack 200-2, due to the structural discontinuity, relatively greater stress may be generated in the local region including the bent portion 200V of the first trench 201 and the second stack 200-2 than in other regions.

The first stress concentration portion 250 configured in this way may be located in the scribe lane region 101 or may be located to overlap with the scribe lane region 101 of the semiconductor substrate 100, as depicted in FIG. 3. The first stress concentration portion 250 may extend along the direction in which the scribe lane region 101 of the semiconductor substrate 100 extends. The first trench 201 that constitutes the first stress concentration portion 250 may also extend along the direction in which the scribe lane region 101 of the semiconductor substrate 100 extends. The first stress concentration portion 250 may extend along the X-axis direction and the Y-axis direction in which the scribe lane region 101 of the semiconductor substrate 100 extends.

Figure 6:
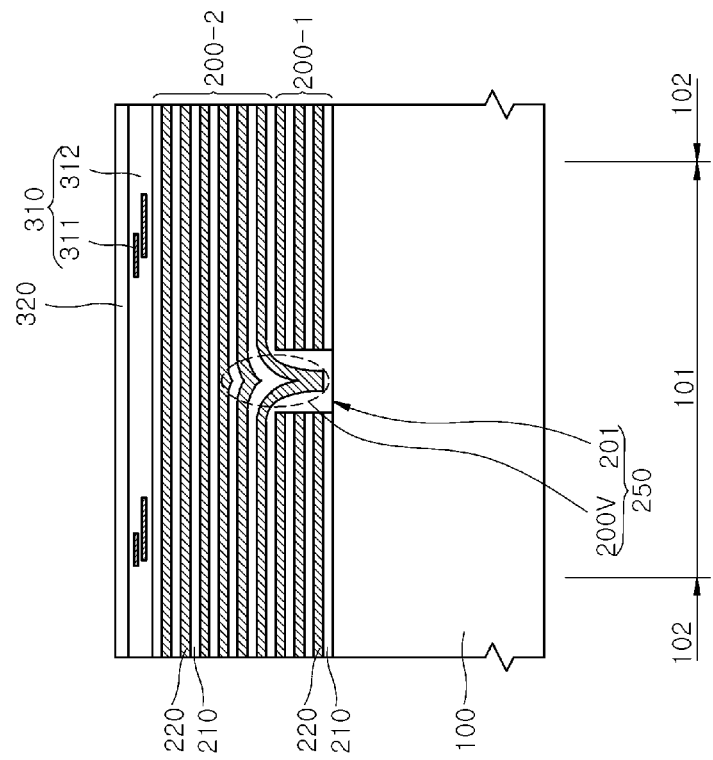

FIG. 6 is a schematic cross-sectional view illustrating a step of forming a multilayer interconnection structure layer 310 and a passivation layer 320 in a method of manufacturing a semiconductor chip according to an embodiment of the present disclosure. FIG. 6 may show the cross-sectional shape that crosses the scribe lane region 101 of the semiconductor substrate 100 of FIG. 3.

Referring to FIGS. 3 and 6, the multilayer interconnection structure layer 310 and the passivation layer 320 may be formed on the second stack 200-2. The multilayer interconnection structure layer 310 may be formed in a structure that includes a plurality of conductive patterns 311 and a plurality of insulating layers 312. The conductive patterns 311 may include test patterns or process monitoring patterns. Each of the conductive patterns 311 may include a metal material such as aluminum (Al) or copper (Cu). The passivation layer 320 may include silicon nitride.

Figure 7:
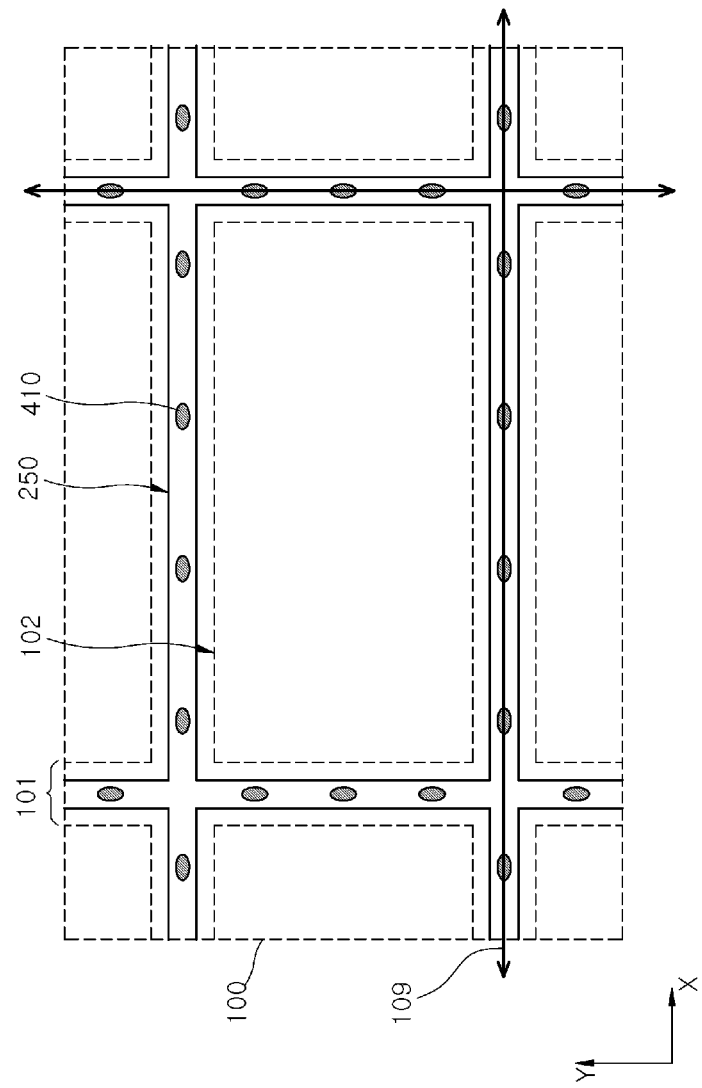
Figure 8:
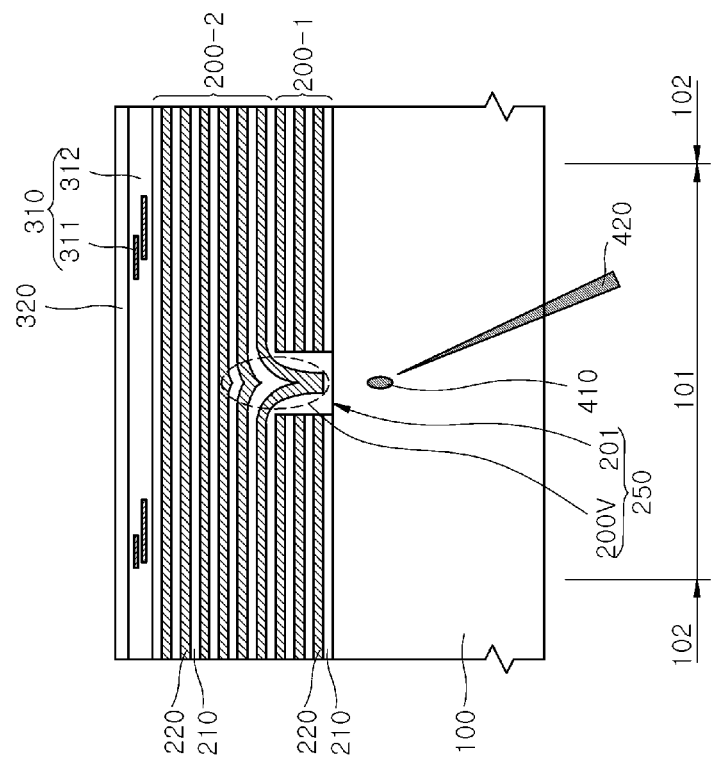

FIG. 7 is a schematic plan view illustrating a shape in which modified patterns 410 are disposed on the semiconductor substrate 100 in a method of manufacturing a semiconductor chip according to an embodiment of the present disclosure. FIG. 8 is a schematic cross-sectional view illustrating a step of forming the modified patterns 410 in a method of manufacturing a semiconductor chip according to an embodiment of the present disclosure. FIG. 8 may show the cross-sectional shape that crosses the scribe lane region 101 of the semiconductor substrate 100 of FIG. 7.

Referring to FIGS. 7 and 8, in order to dice the semiconductor substrate 100, a dicing process using a laser, for example, a stealth dicing process may be performed. The modified patterns 410 may be formed in some portions of the semiconductor substrate 100 in the scribe lane region 101. The modified patterns 410 may be formed in the semiconductor substrate 100 by irradiating a laser 420 while focusing the laser on the positions of the modified patterns 410 in the semiconductor substrate 100.

The modified patterns 410 may be modified to have different physical properties from that of the semiconductor substrate 100. As some portions of the semiconductor substrate 100 are modified by the irradiation of the laser 420, the modified patterns 410 may be formed in the semiconductor substrate 100. When the semiconductor substrate 100 includes single crystal silicon, each of the modified patterns 410 may include amorphous silicon or polycrystalline silicon.

As the single crystal silicon is modified into amorphous silicon or polycrystalline silicon, stress may be induced around the modified patterns 410 due to a change in the crystal structure. The modified patterns 410 may cause stress therearound, and each of the modified patterns 410 may act as a factor generating cracks by the stress.

The laser 420 may be irradiated so that a plurality of modified patterns 410 are generated at a regular interval along the scribe lane region 101. The modified patterns 410 may be formed to be regularly repeated at a regular interval in the semiconductor substrate 100 of the scribe lane region 101. The modified patterns 410 may be formed to be spaced apart from each other at an interval of several micrometers ($\mu m$) to several tens of micrometers ($\mu m$). For example, the modified patterns 410 may be spaced apart from each other at an interval of approximately 2 $\mu m$ to 10 $\mu m$. Each of the modified patterns 410 may have a size of several micrometers ($\mu m$) to several tens of micrometers ($\mu m$). The modified pattern 410 may have an ellipsoidal shape elongated in the thickness direction of the semiconductor substrate 100.

The modified patterns 410 may be located in the portions of the semiconductor substrate 100, overlapping with the first stress concentration portion 250. The plurality of modified patterns 410 may be formed while being sequentially spaced apart from each other in the direction in which the first stress concentration portion 250 extends. The plurality of modified patterns 410 may be formed while being sequentially spaced apart from each other in the direction in which the first trench 201 of the first stress concentration portion 250 extends.

Figure 9:
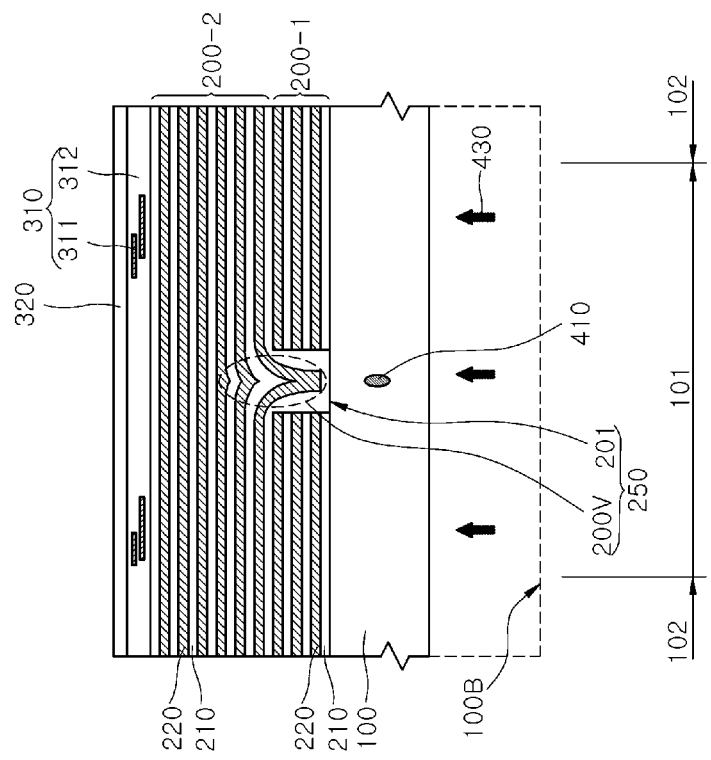

FIG. 9 is a schematic cross-sectional view illustrating a step of back-grinding 430 the semiconductor substrate 100 according to an embodiment of the present disclosure. FIG. 9 may show the cross-sectional shape that crosses the scribe lane region 101 of the semiconductor substrate 100 of FIG. 7.

Referring to FIG. 9, after forming the modified patterns 410 in the semiconductor substrate 410, a process step of thinning the semiconductor substrate 100. A process step of removing a portion of the thickness of the semiconductor substrate 100 may be performed from a rear surface 100B of the semiconductor substrate 100. By back-grinding 430 the rear surface 100B of the semiconductor substrate 100, the thickness of the semiconductor substrate 100 may be reduced. The back-grinding process may be performed using a grinder. In an embodiment, by reducing the thickness of the semiconductor substrate 100, failures in which the semiconductor substrate 100 is not diced in the process of dicing the semiconductor substrate 100 may be reduced.

Figure 10:
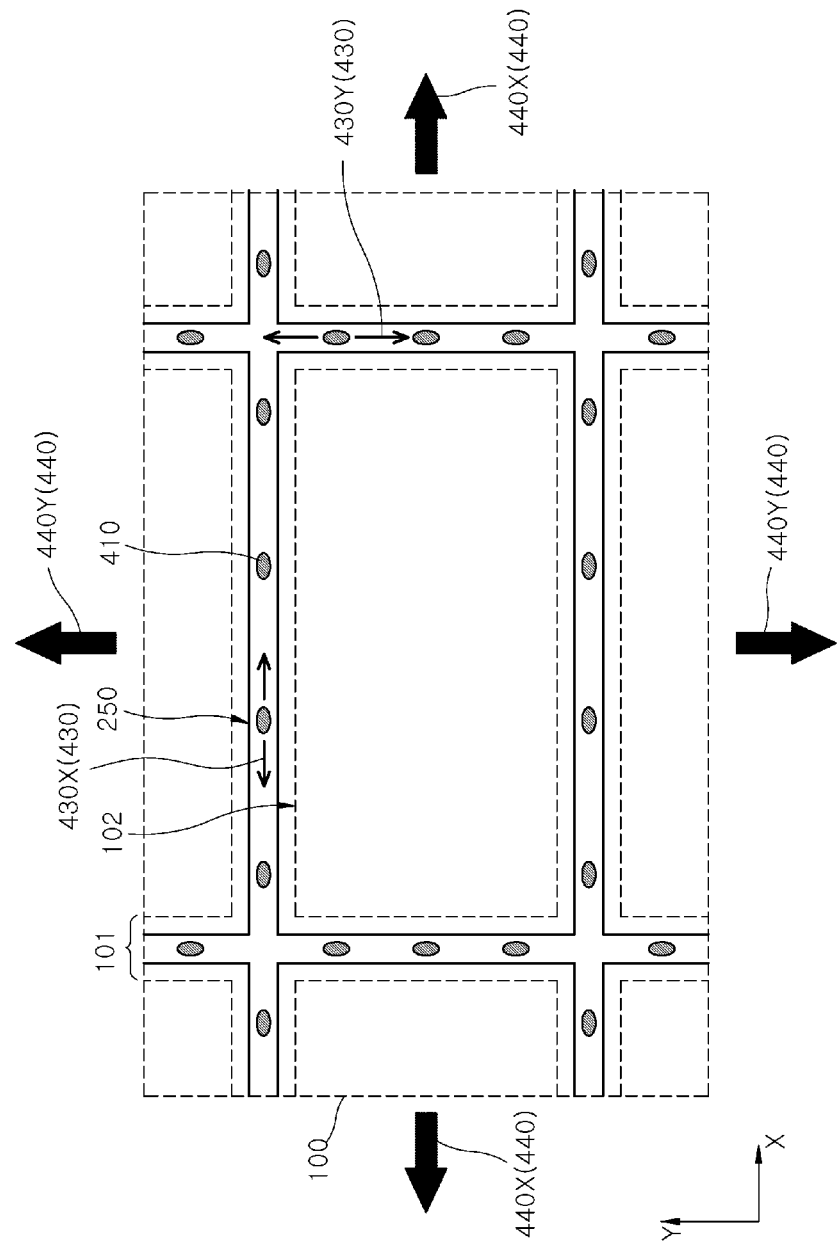
Figure 11:
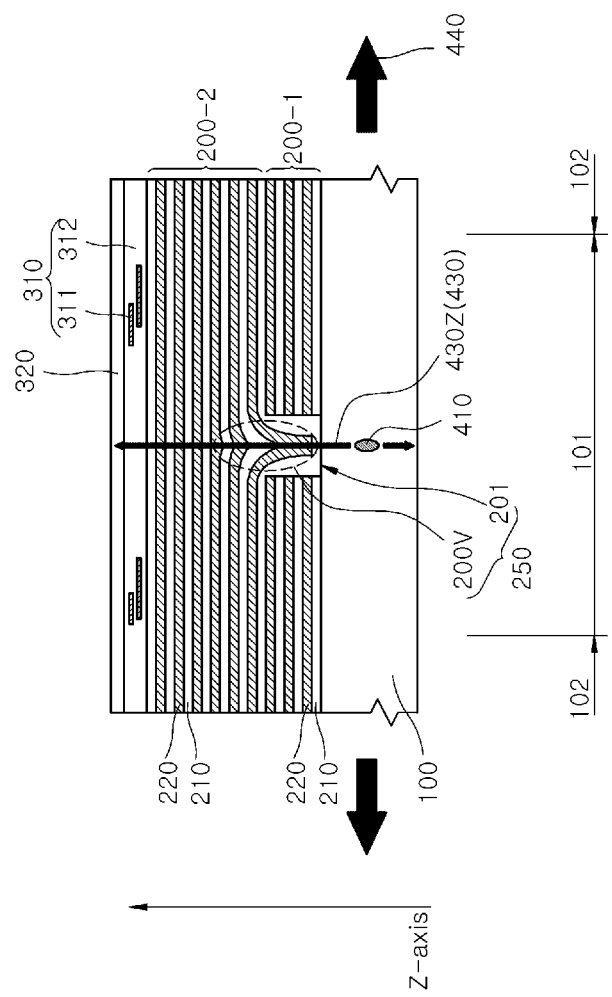

FIG. 10 is a schematic plan view illustrating a step of crack-propagating cracks in a method of semiconductor chip according to the embodiment of the present disclosure. FIG. 11 is a schematic cross-sectional view illustrating the step of crack-propagating 430 the cracks in a method of semiconductor chip according to an embodiment of the present disclosure. FIG. 11 may show the cross-sectional shape that crosses the scribe lane region 101 of the semiconductor substrate 100 of FIG. 10.

Referring to FIGS. 10 and 11, the crack-propagation 430 may be performed from the modified patterns 410 to penetrate the semiconductor substrate 100. The cracks may be crack-propagated 430 to penetrate the first and second stacks 200-1 and 200-2. As the modified patterns 410 are formed in the semiconductor substrate 100 in the scribe lane region 101, an environment in which stress can be concentrated around the modified patterns 410 may be formed. When an external force 440 that expands the semiconductor substrate 100 is applied to the semiconductor substrate 100, stress may be concentrated around the modified patterns 410, and cracks may be generated around the modified patterns 410 by the stress concentration. The generated cracks may be grown and crack-propagated 430 within the semiconductor substrate 100 by the expansion external force 440 that expands the semiconductor substrate 100. The semiconductor substrate 100 may be diced by the crack generation and crack-propagation 430.

Referring to FIG. 11, the first stress concentration portion 250 may be located over the modified pattern 410 to overlap with the modified pattern 410. When the external force 440 that expands the semiconductor substrate 100 is applied to the semiconductor substrate 100, stress may also be concentrated on the first stress concentration portion 250 in addition to the modified patterns 410. The stress caused around the first stress concentration portion 250 may guide the crack-propagation 430 in the direction from the modified pattern 410 toward the first stress concentration portion 250. The stress caused around the first stress concentration portion 250 may guide the crack-propagation 430Z in the direction that crosses the semiconductor substrate 100 along the Z-axis to be more dominant than the propagation in directions other than the Z-axis direction. Accordingly, the cracks may propagate in the Z-axis direction to penetrate the first and second stacks 200-1 and 200-2. The cracks may propagate in the Z-axis direction to cross the first stress concentration portion 250 in the Z-axis direction.

Each of the first and second stacks 200-1 and 200-2 may include first material layers 210 and second material layers 220 that are alternately stacked. In an embodiment, the interface between the stacked first material layer 210 and the second material layer 220 may act as an element that prevents or mitigates the crack-propagation 430Z in the Z-axis direction. In an embodiment, the first stress concentration portion 250 may act as an element that promotes, guides, or leads the crack or cracks to propagate in the Z-axis direction. In this way, in an embodiment, the first stress concentration portion 250 may guide the crack or cracks to be crack-propagated 430Z in the Z-axis direction, and thus, it is possible to reduce the occurrence of dicing failures in which cracks do not penetrate the first material layers 210 and the second material layers 220.

The expansion external force 440 that expands the semiconductor substrate 100 may include an X-axis direction expansion external force 440X that expands the semiconductor substrate 100 in the X-axis direction and a Y-axis direction expansion external force 440Y that expands semiconductor substrate 100 in the Y-axis direction. Crack-propagation 430Y may be induced in the Y-axis direction from the modified patterns 410 by the X-axis direction expansion external force 440X. The crack-propagation 430Y may proceed in the Y-axis direction, and accordingly, the semiconductor substrate 100 may be diced in the Y-axis direction. The crack-propagation 430X may be induced from the modified patterns 410 in the X-axis direction by the Y-axis direction expansion external force 440Y. The crack-propagation 430X may proceed in the X-axis direction, and accordingly, the semiconductor substrate 100 may be diced in the X-axis direction.

Figure 12:
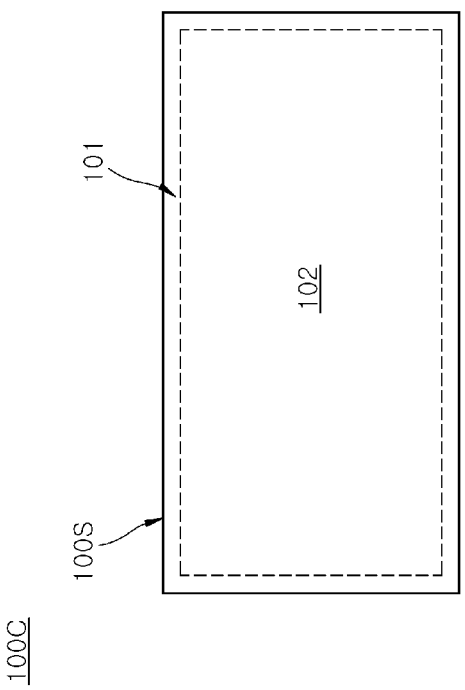
Figure 13:
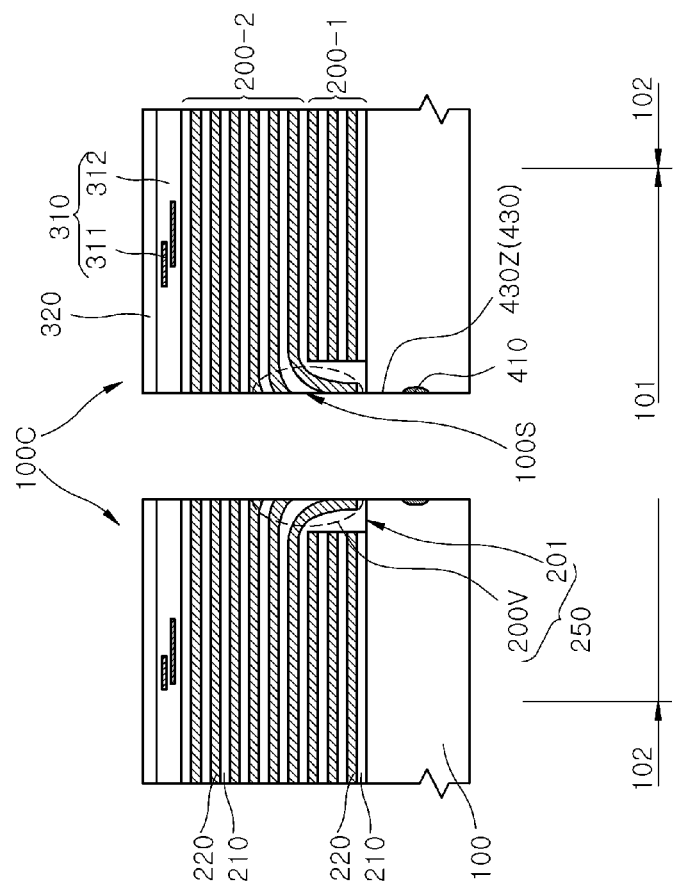

FIG. 12 is a schematic plan view illustrating a semiconductor chip 100C that is diced by a method of manufacturing a semiconductor chip according to an embodiment of the present disclosure. FIG. 13 is a schematic cross-sectional view illustrating the semiconductor chip 100C that is diced by a method of manufacturing a semiconductor chip according to an embodiment of the present disclosure.

Referring to FIGS. 12 and 13, in an embodiment, the semiconductor substrate 100 and the first and second stacks 200-1 and 200-2 may be diced by the assistance of the first stress concentration portion 250 without a dicing failure. Accordingly, the semiconductor chips 100C may be separated from the semiconductor substrate 100. The crack or cracks may be propagated to penetrate the semiconductor substrate 100 and the first and second stacks 200-1 and 200-2 from the modified patterns 410, and thus, dicing surfaces 100S may be formed. Some portions of the modified patterns 410 and a portion of the first stress concentration portion 250 may be exposed to the dicing surfaces 100S.

Figure 14:
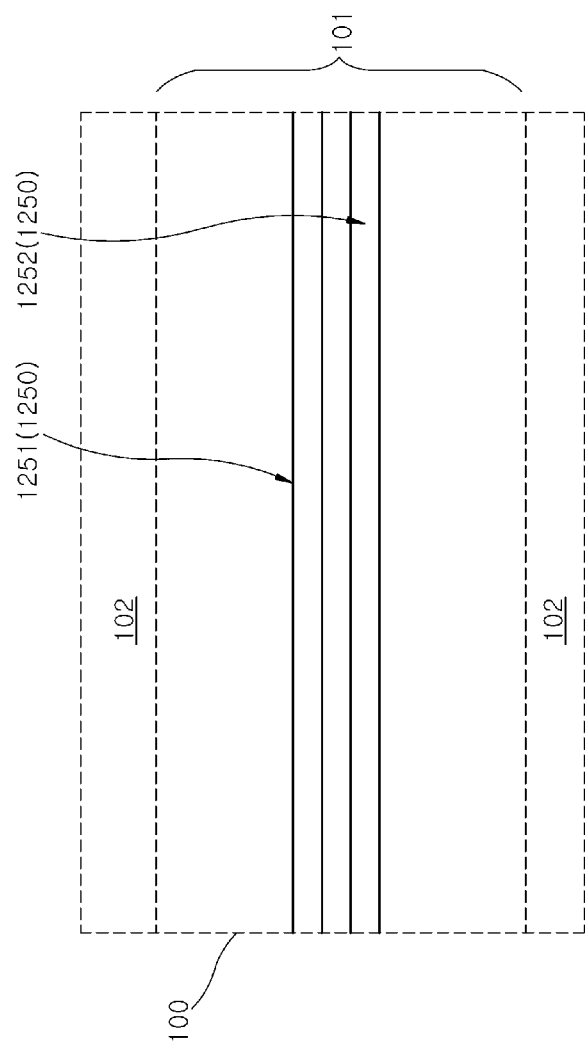
FIGS. 14 and 15 are schematic views illustrating a shape in which stress concentration portions are disposed in a method of manufacturing a semiconductor chip according to another embodiment of the present disclosure.
Figure 15:
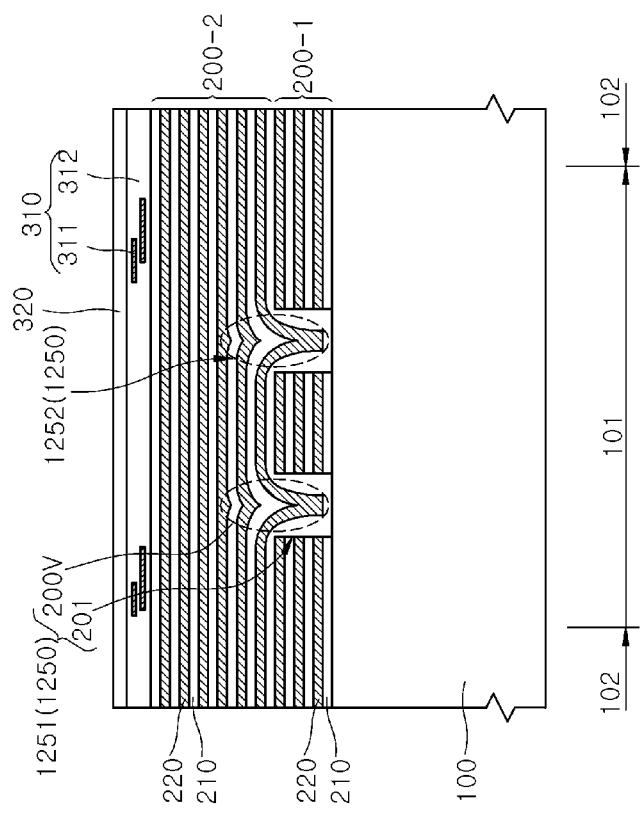

FIG. 14 is a schematic view illustrating a shape in which stress concentration portions 1250 are disposed on a semiconductor substrate 100 in a method of manufacturing a semiconductor chip according to an embodiment of the present disclosure. FIG. 15 is a schematic cross-sectional view illustrating a shape in which the stress concentration portions 1250 are formed on the semiconductor substrate 100 in a method of manufacturing a semiconductor chip according to an embodiment of the present disclosure. FIG. 15 may show the cross-sectional shape that crosses a scribe lane region 101 of the semiconductor substrate 100 of FIG. 14.

Referring to FIGS. 14 and 15, the first stress concentration portion 1250 including a plurality of sub stress concentration portions 1251 and 1252 may be disposed on the semiconductor substrate 100 of the scribe lane region 101. The first stress concentration portion 1250 may include the first sub stress concentration portion 1251 and the second sub stress concentration portion 1252 that are disposed side by side. Additional sub stress concentration portions may be further disposed in a region between the first sub stress concentration portion 1251 and the second sub stress concentration portion 1252 or in a region outside the first sub stress concentration portion 1251 and the second sub stress concentration portion 1252. Each of the first and second sub stress concentration portions 1251 and 1252 may include a first trench 201 and a bent portion 200V of a second stack 200-2.

Figure 16:
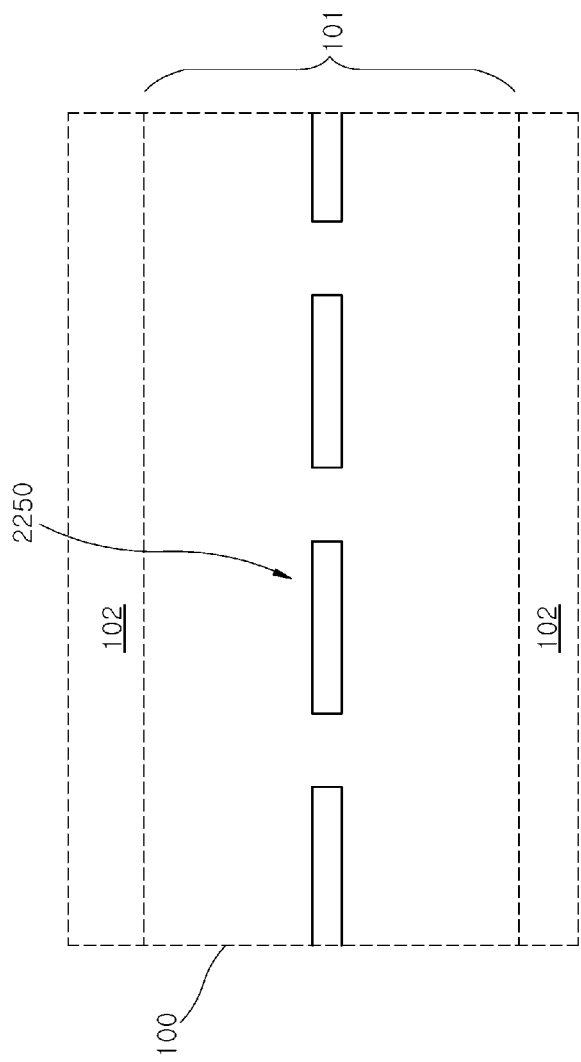
FIG. 16 is a schematic view illustrating a shape in which stress concentration portions are disposed in a method of manufacturing a semiconductor chip according to another embodiment of the present disclosure.

FIG. 16 is a schematic view illustrating a shape in which first stress concentration portions 2250 are disposed on a semiconductor substrate 100 in a method of manufacturing a semiconductor chip according to an embodiment of the present disclosure.

Referring to FIG. 16, a plurality of first stress concentration portions 2250 may be disposed in a single column on the semiconductor substrate 100 of a scribe lane region 101. The plurality of first stress concentration portions 2250 may be disposed in a single column along the direction in which the scribe lane region 101 extends. In another embodiment, the plurality of first stress concentration portions 2250 may be disposed in plural columns along the direction in which the scribe lane region 101 extends.

Figure 17:
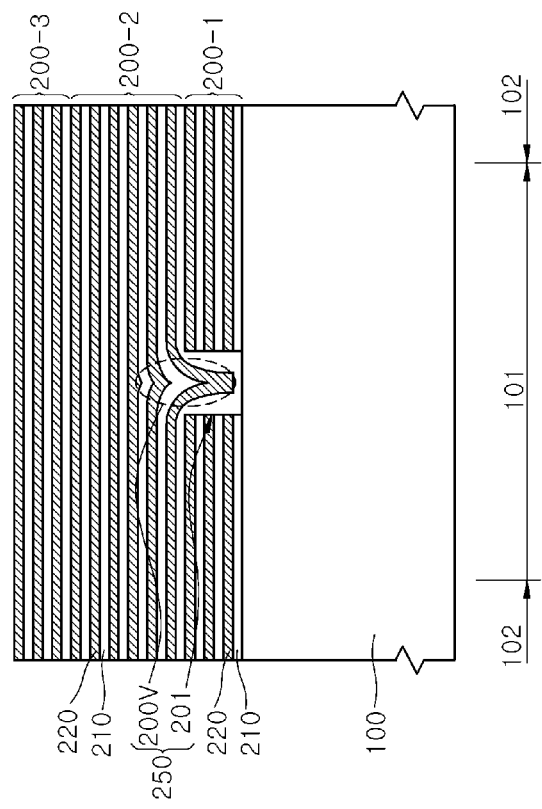
FIGS. 17 to 20 are schematic views illustrating a method of manufacturing a semiconductor chip according to another embodiment of the present disclosure.

FIGS. 17 to 20 are schematic views illustrating a method of manufacturing a semiconductor chip according to another embodiment of the present disclosure. FIG. 17 is a schematic cross-sectional view illustrating a step of forming a third layer stack 200-3 in a method of manufacturing a semiconductor chip according to another embodiment of the present disclosure.

Referring to FIG. 17, a method of manufacturing a semiconductor chip according to an embodiment may further include the step of forming the third layer stack 200-3 on a second stack 200-2. The material layers 210 and 220 that constitute a first stack 200-1 and the second stack 200-2 may be further stacked on the second stack 200-2 to form the third layer stack 200-3. For example, the third layer stack 200-3 may be formed by further alternately forming the first material layer 210 and the second material layer 220 on the second stack 200-2. The third layer stack 200-3 may have a smaller number of stages of the material layers 210 and 220 than the second stack 200-2. The third layer stack 200-3 may have the same number of stages of the material layers 210 and 220 as the first stack 200-1. In another embodiment, the third layer stack 200-3 may be formed by alternately stacking layers of an insulating material other than the first material layer 210 and the second material layer 220.

Figure 18:
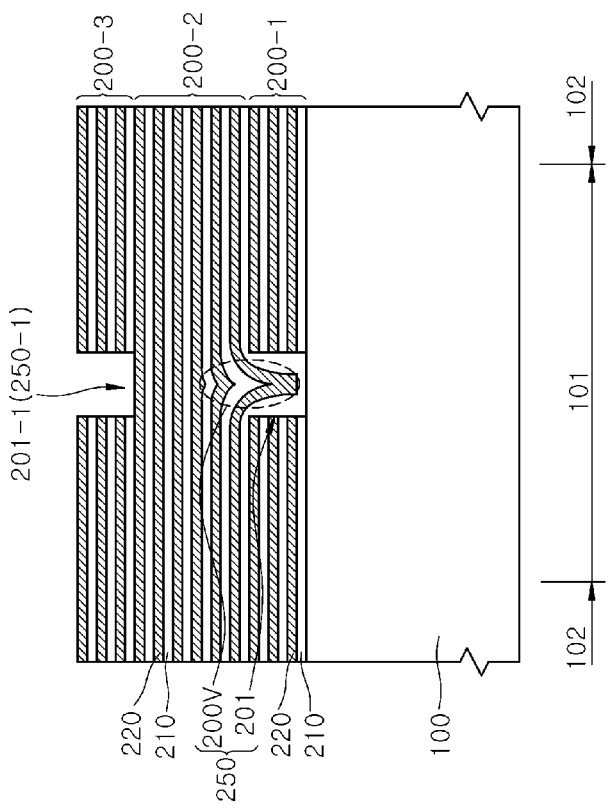

FIG. 18 is a schematic cross-sectional view illustrating a step of forming a second trench 201-1 in the third layer stack 200-3 in a method of manufacturing a semiconductor chip according to an embodiment of the present disclosure.

Referring to FIG. 18, the second trench 201-1 may be formed to penetrate the third layer stack 200-3 of the semiconductor substrate 100. The second trench 201-1 may be formed as an element that constitutes a second stress concentration portion 250-1. As the second trench 201-1 is formed, the third layer stack 200-3 may be divided into two portions separated into left and right of the second trench 201-1. The second trench 201-1 may be located over the scribe lane region 101 of the semiconductor substrate 100. The second trench 201-1 may be formed at a position overlapping with the first trench 201. The second trench 201-1 may extend long along the scribe lane region 101 of the semiconductor substrate 100.

Figure 19:
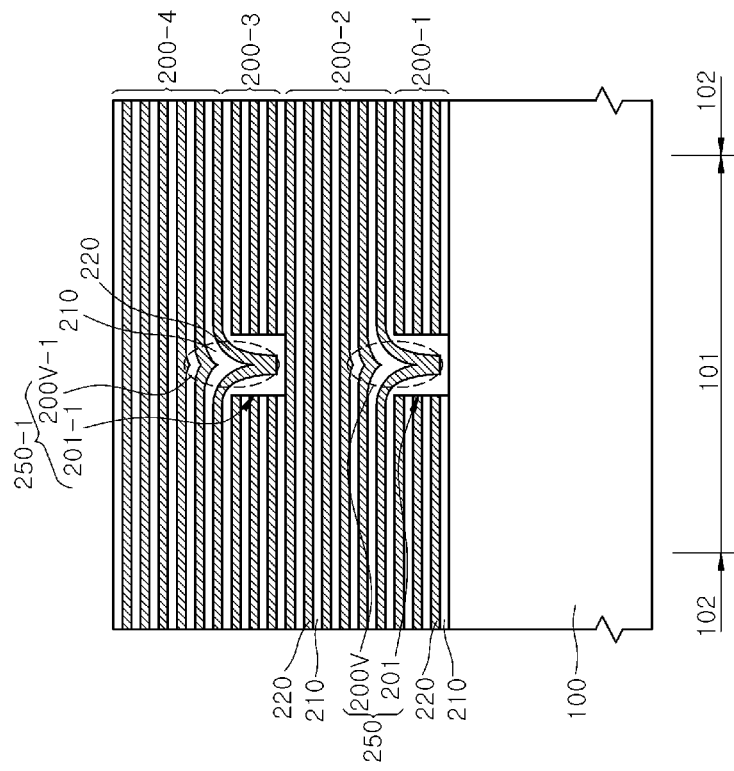

FIG. 19 is a schematic cross-sectional view illustrating a step of forming a second stress concentration portion 250-1 in a fourth layer stack 200-4 in a method of manufacturing a semiconductor chip according to an embodiment of the present disclosure.

Referring to FIG. 19, the fourth layer stack 200-4 may be formed on the third layer stack 200-3. The material layers 210 and 220 may be further stacked on the third layer stack 200-3 to form the fourth layer stack 200-4. For example, the fourth layer stack 200-4 may be formed by further by alternately forming the first material layers 210 (i.e., additional first material layers) and the second material layers 200 (i.e., additional second material layers). The fourth layer stack 200-4 may have a greater number of stages of the material layers 210 and 220 than the third layer stack 200-3. The fourth layer stack 200-4 may include several tens of stages of material layers 210 and 220. In another embodiment, the fourth layer stack 200-4 may be formed by alternately stacking layers of an insulating material other than the first material layer 210 and the second material layer 220.

As the fourth layer stack 200-4 is formed, a portion of the fourth layer stack 200-4 may extend and be bent into the second trench 201-1 to form an additional bent portion 200V-1. Due to the step structure or step shape caused by the second trench 201-1, the bent portion 200V-1 of the fourth layer stack 200-4 may be formed in a shape the portion of the fourth layer stack 200-4 is bent into the second trench 200V-1. The structure including the bent portion 200V-1 of the fourth layer stack 200-4 and the second trench 201-1 may constitute the second stress concentration portion 250-1. The second stress concentration portion 250-1 may be formed over the second stack 200-2 to overlap with the first stress concentration portion 250.

Figure 20:
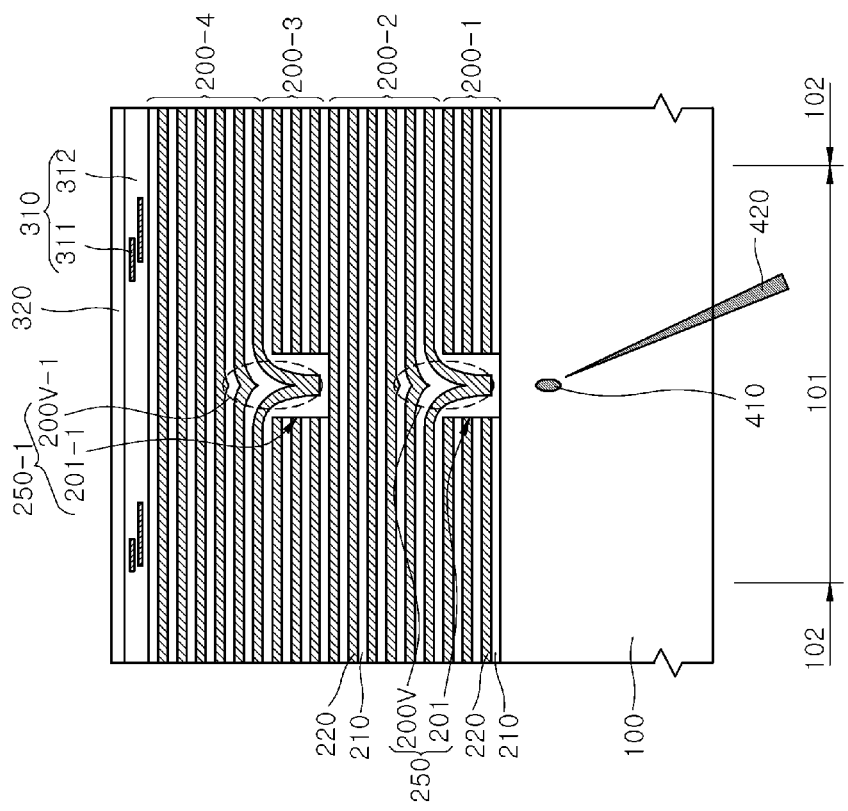

FIG. 20 is a schematic cross-sectional view illustrating a step of forming a modified pattern 410 in a method of manufacturing a semiconductor chip according to an embodiment of the present disclosure.

Referring to FIG. 20, a multilayer interconnection structure layer 310 and a passivation layer 320 may be formed on the fourth layer stack 200-4. The multiplayer interconnection structure layer 310 may be formed in a structure including a plurality of conductive patterns 311 and a plurality of insulating layers 312.

The modified pattern 410 may be formed in a portion of the semiconductor substrate 100 of the scribe lane region 101. The modified pattern 410 may be formed in the semiconductor substrate 100 by irradiating a laser 420 while focusing the laser on the position of the modified pattern 410 in the semiconductor substrate 100. The modified pattern 410 may be located to overlap with the first stress concentration portion 250. The modified pattern 410 may be located to overlap with the second stress concentration portion 250-1.

Thereafter, as described with reference to FIG. 9, in an embodiment, the thickness of the semiconductor substrate 100 may be reduced, and cracks may be propagated as described with reference to FIG. 11, thereby dicing the semiconductor substrate 100 into semiconductor chips. In an embodiment, because the second stress concentration portion 250-1 is located to overlap with the first stress concentration portion 250 and the modified pattern 410, the first, second, third, and fourth layer stacks 200-1, 200-2, 200-3, and 200-4 may be diced without dicing failures. In an embodiment, the second stress concentration portion 250-1 may guide the crack-propagation such that the third and fourth layer stacks 200-3 and 200-4 are diced without failures. Accordingly, in an embodiment, it is possible to stack the first and second material layers 210 and 220 on the semiconductor substrate 100 in more stages than the first and second stacks 200-1 and 200-2.

Figure 21:
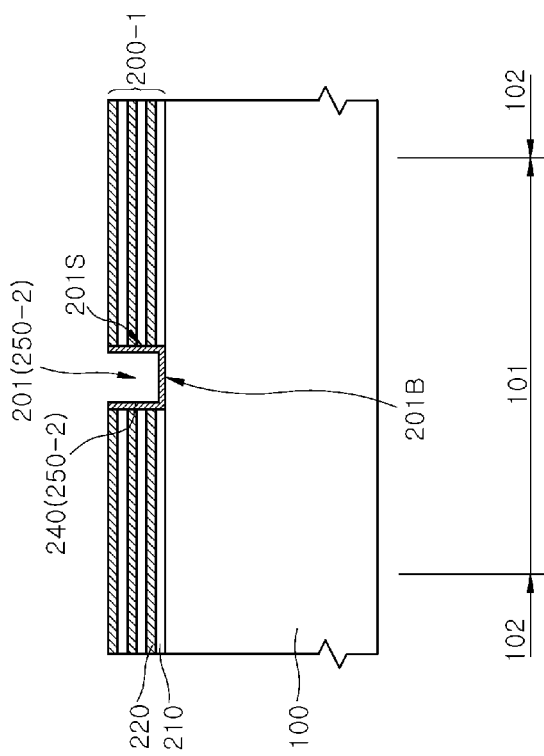
FIGS. 21 and 22 are schematic views illustrating a method of manufacturing a semiconductor chip according to another embodiment of the present disclosure.
Figure 22:
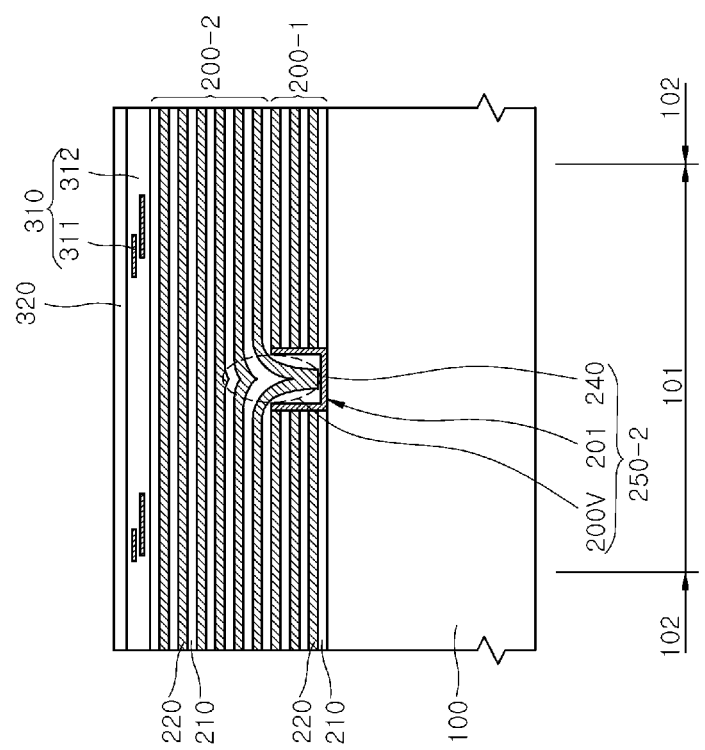

FIGS. 21 and 22 are schematic views illustrating a method of manufacturing a semiconductor chip according to another embodiment of the present disclosure. FIG. 21 is a schematic cross-sectional view illustrating a step of forming a spacer 240 of a first stress concentration portion 250-2 in a method of manufacturing a semiconductor chip according to an embodiment of the present disclosure.

Referring to FIG. 21, a first trench 201 may be formed in a first stack 200-1 on a semiconductor substrate 100, and the space 240 may be formed on the sidewall 200S of a first trench 201. The spacer 240 may be formed as an element that constitutes the first stress concentration portion 250-2 with the first trench 201. The spacer 240 may cover the sidewall 201S of the first trench 201 and may further extend to cover a bottom surface 201B of the first trench 201. Accordingly, the spacer 240 may be formed as a layer having a shape of a concave nest. The spacer 240 may include a material layer that is different from the first and second material layers 210 and 220 that constitute the first stack 200-1. The spacer 240 may include a metal material that is different from the materials included in the first and second material layers 210 and 220. For example, the spacer 240 may include titanium nitride TiN. In an embodiment, the titanium nitride TiN may be a material in which cracks are easier to be propagated than silicon oxide or silicon nitride. In an embodiment, because the spacer 240 is formed of a material different from that of the first stack 200-1, it may be easier for the cracks to progress along the spacer 240 or along the interface between the spacer 240 and the sidewall 201S of the first trench 201.

FIG. 22 is a schematic cross-sectional view illustrating a step of forming the first stress concentration portion 250-2 in a method of manufacturing a semiconductor chip according to an embodiment of the present disclosure.

Referring to FIG. 22, a second stack 200-2 may be formed on the first stack 200-1. As the second stack 200-2 is formed, a portion of the second stack 200-2 may extend and be bent into the first trench 201, thereby forming a bent portion 200V. Due to the step structure or step shape caused by the first trench 201 and the spacer 240, the bent portion 200V of the second stack 200-2 may be formed in a bent shape into the first trench 201.

The structure including the bent portion 200V of the second stack 200-2, the first trench 201, and the spacer 240 may constitute the first stress concentration portion 250-2. The first stress concentration portion 250-2 may provide a structure on which stress may be concentrated, compared to other portions of the semiconductor substrate 100 or the layer stacks 200-1 and 200-2.

Figure 23:
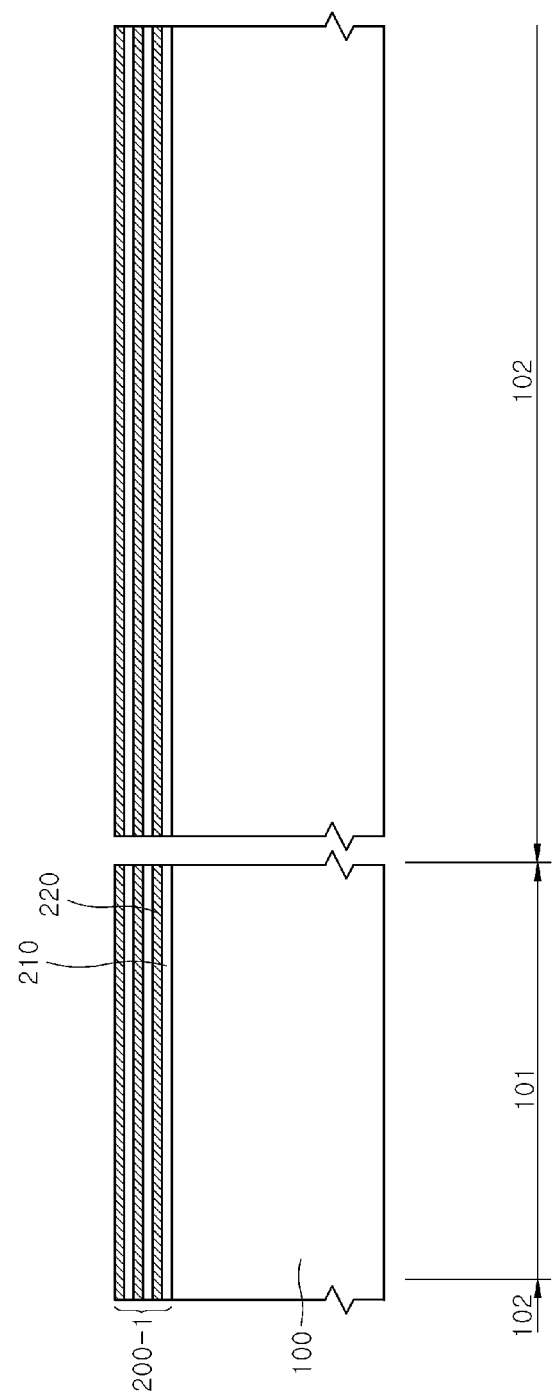
FIGS. 23 to 33 are schematic views illustrating a method of manufacturing a semiconductor chip according to another embodiment of the present disclosure.

FIGS. 23 to 33 are schematic views illustrating a method of manufacturing a semiconductor chip according to an embodiment of the present disclosure. FIG. 23 is a schematic cross-sectional view illustrating a step of forming a first stack 200-1 of a method of manufacturing a semiconductor chip according to an embodiment of the present disclosure. FIG. 23 may show the cross-sectional shape that crosses the scribe lane region 101 and a chip region 102 of the semiconductor substrate 100 of FIG. 1.

Referring to FIG. 23, the semiconductor substrate 100 may include the scribe lane region 101 and the chip region 102. The first stack 200-1 may be formed on the scribe lane region 101 of the semiconductor substrate 100. The first stack 200-1 may be formed on the scribe lane region 101, and may extend on the chip region 102. The first stack 200-1 may be formed by alternately and repeatedly stacking different material layers 210 and 220. The first stack 200-1 may include, for example, material layers 210 and 220 that are stacked in six stages.

Figure 24:
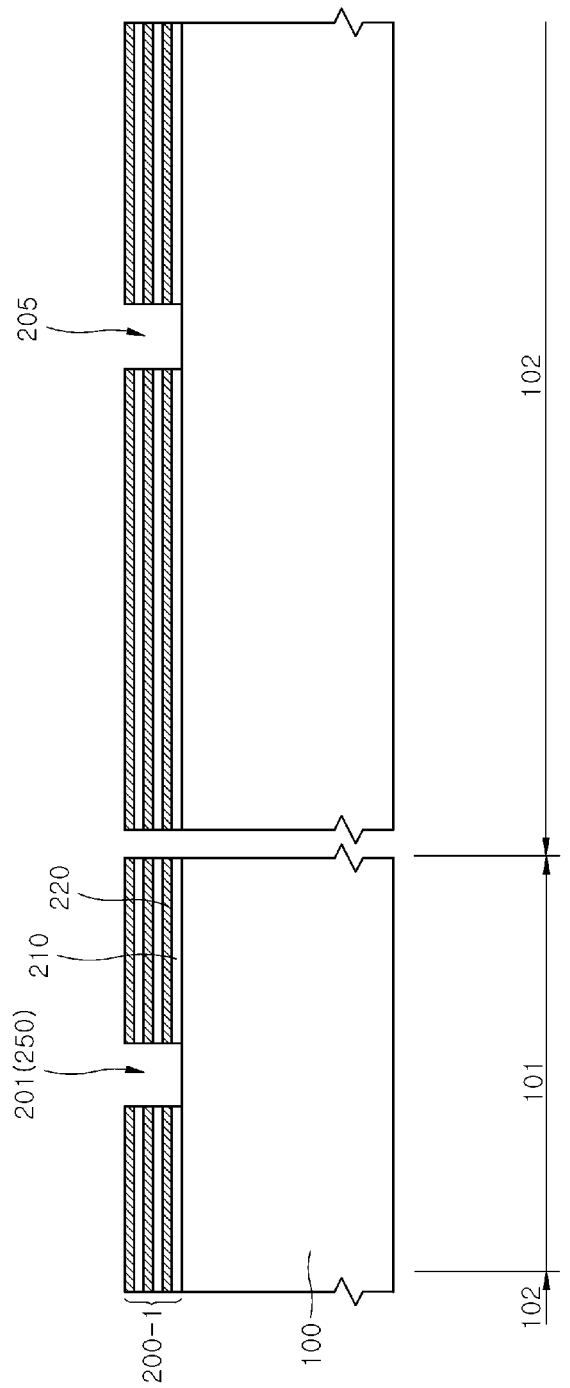

FIG. 24 is a schematic cross-sectional view illustrating a step of forming a first trench 201 and a third trench 205 in the first stack 200-1 in a method of manufacturing a semiconductor chip according to an embodiment of the present disclosure.

Referring to FIG. 24, the first trench 201 and the third trench 205 may be formed to penetrate the first stack 200-1 of the semiconductor substrate 100. Some portions of the first stack 200-1 of the semiconductor substrate 100 may be selectively etched and removed to form the first trench 201 located to overlap with the scribe lane region 101 and the third trench 205 located to overlap with the chip region 102 together. The first trench 201 and the third trench 205 may be understood as terms used to distinguish the trenches located at different positions. Similarly, the second trench 201-1 used in the description with reference to FIG. 18 may also be understood as a term used to distinguish the trenches. The first trench 201, the second trench 201-1, and the third trench 205 are not used to indicate any order of the trenches. The first trench 201 may be formed as an element constituting the first stress concentration portion 250 described with reference to FIG. 5, but the third trench 205 might not be used as an element constituting the first stress concentration portion 250. The third trench 205 may be formed as an element for separating a portion of the first stack 200-1 overlapping with the chip region 102 into left and right portions. The third trench 205 may be formed as an element for dividing and separating the second material layer 220 into two portions.

Figure 25:
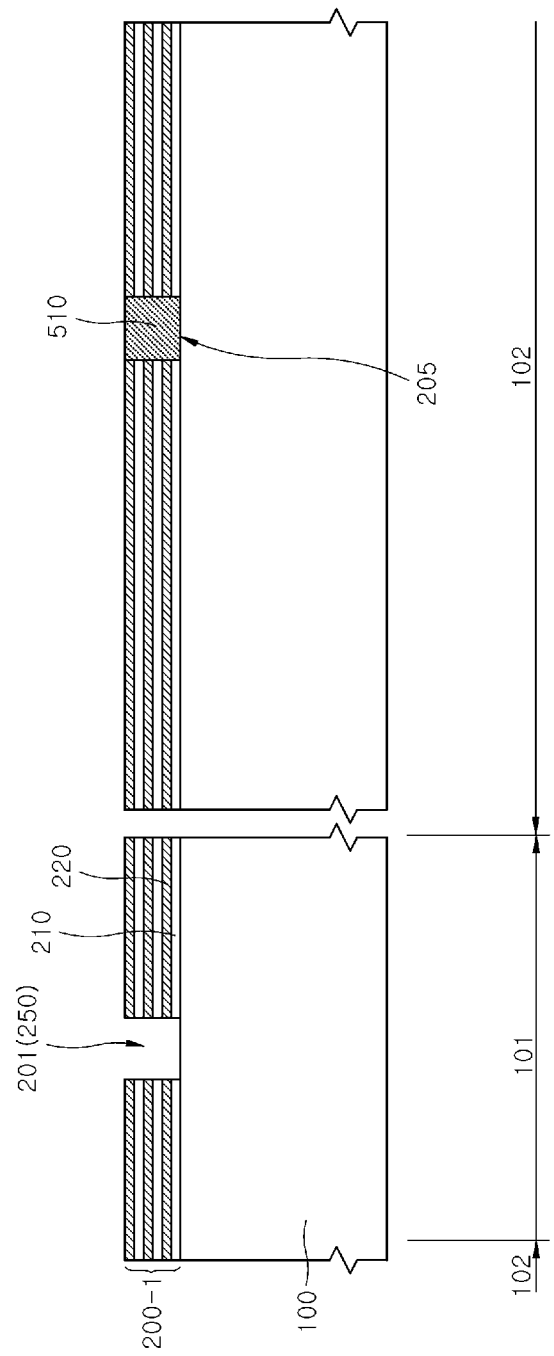

FIG. 25 is a schematic view illustrating a step of forming an insulating pattern 510 in a method of manufacturing a semiconductor chip according to an embodiment of the present disclosure.

Referring to FIG. 25, an insulating material may be deposited to fill the third trench 205 formed in the first stack 200-1, thereby forming the insulating pattern 510. The insulating pattern 510 may include, for example, silicon oxide. The insulating pattern 510 may be formed to divide the first stack 200-1 located over the chip region 102.

Figure 26:
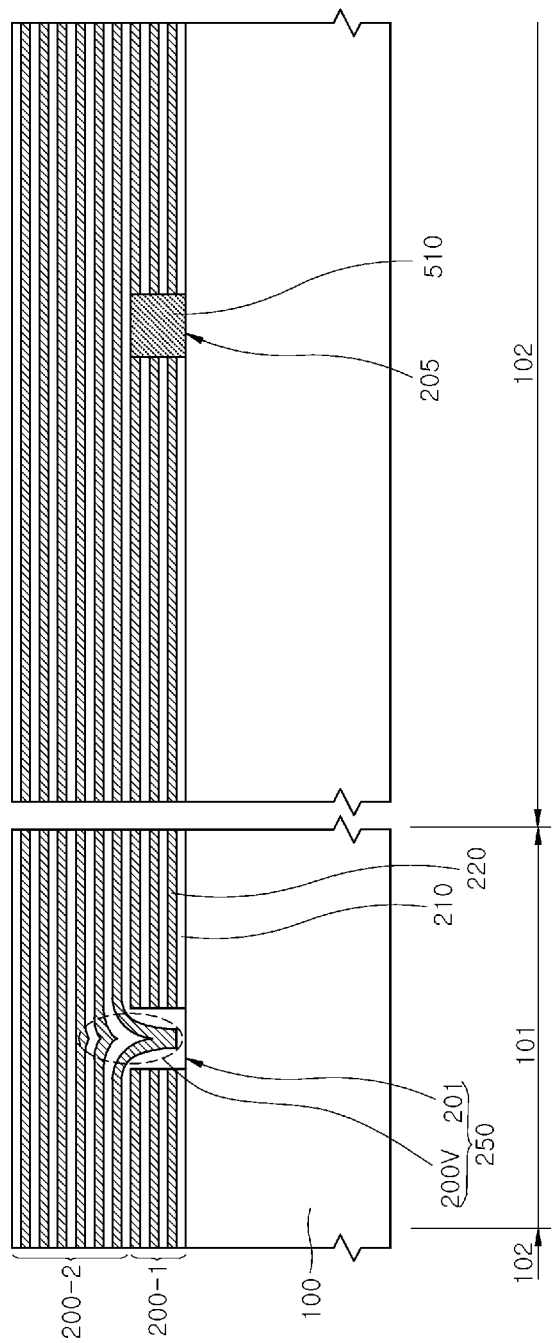

FIG. 26 is a schematic cross-sectional view illustrating a step of forming a second stack 200-2 and the first stress concentration portion 250 in a method of manufacturing a semiconductor chip according to an embodiment of the present disclosure.

Referring to FIG. 26, the second stack 200-2 may be formed on the first stack 200-1. The material layers 210 and 220 may be further stacked on the first stack 200-1 to form the second stack 200-2. For example, the second stack 200-2 may be formed by further alternately forming the first material layers 210 and the second material layers 220 on the first stack 200-1. The second stack 200-2 may extend to cover the insulating pattern 510 located over the chip region 102.

As the second stack 200-2 is formed, a portion of the second stack 200-2 may extend and be bent into the first trench 201 to form a bent portion 200V. The structure including the bent portion 200V of the second stack 200-2 and the first trench 201 may constitute the first stress concentration portion 250. The first stress concentration portion 250 may be located only in the scribe lane region 101, and the first stress concentration portion 250 might not be located in the chip region 102.

Figure 27:
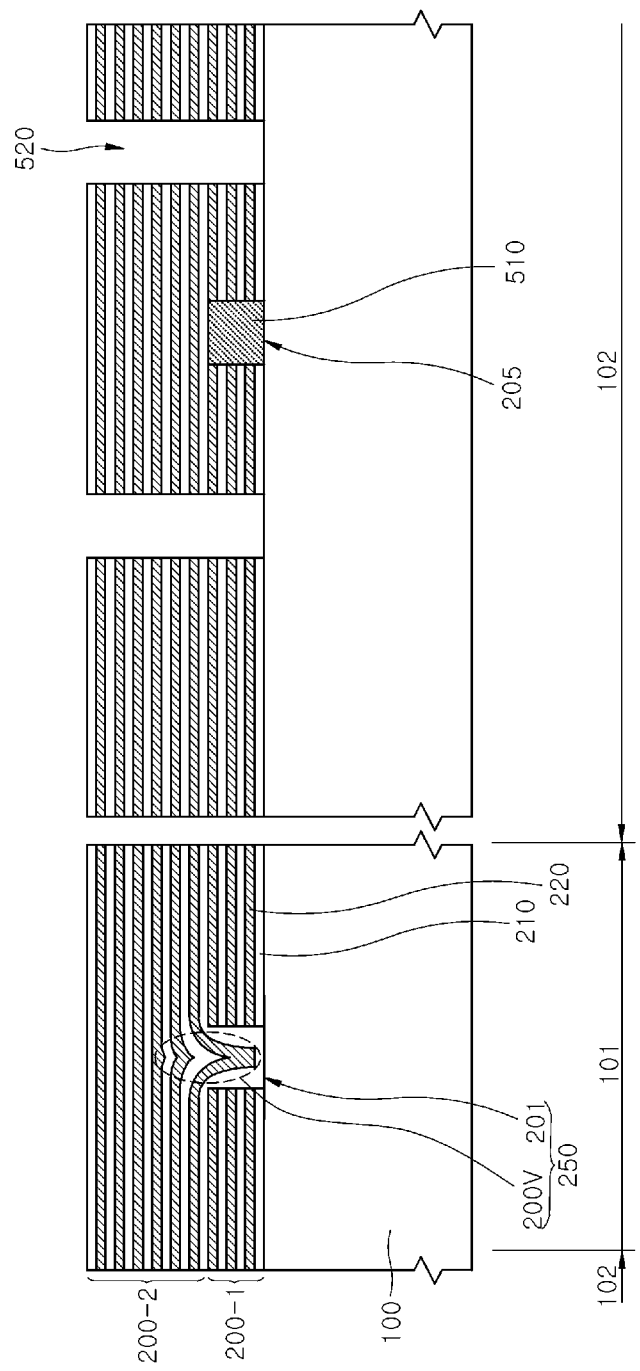

FIG. 27 is a schematic cross-sectional view illustrating a step of forming channel holes 520 in the first and second stacks 200-1 and 200-2 in a method of manufacturing a semiconductor chip according to an embodiment of the present disclosure.

Referring to FIG. 27, the channel holes 520 may be formed to vertically penetrate the first and second stacks 200-1 and 200-2. Some portions of the first and second stacks 200-1 and 200-2 may be selectively etched and removed to form the channel holes 520. The channel holes 520 may be located to overlap with the chip region 102 of the semiconductor substrate 100.

Figure 28:
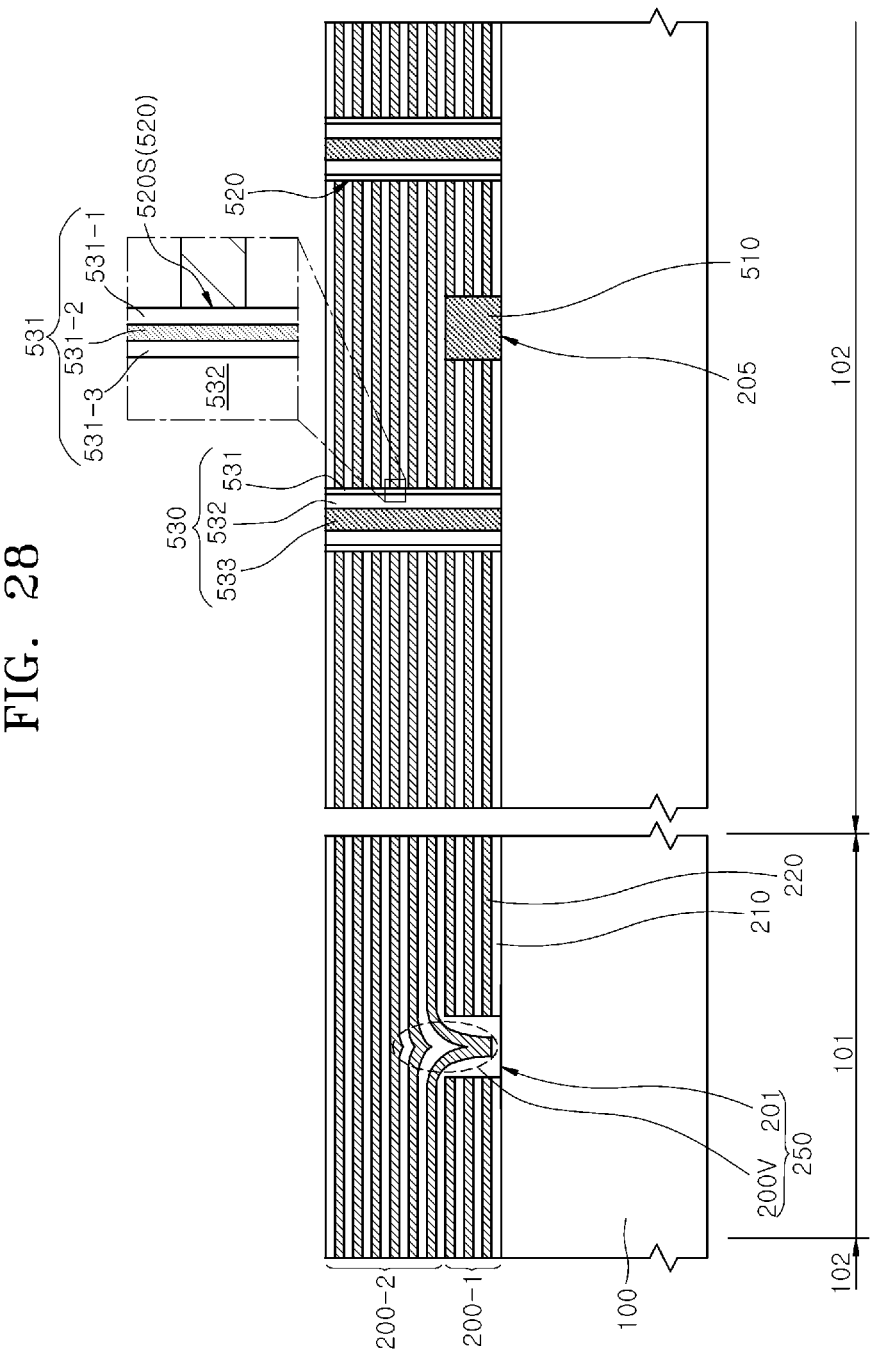

FIG. 28 is a schematic cross-sectional view illustrating a step of forming vertical channel structures 530 in a method of manufacturing a semiconductor chip according to an embodiment of the present disclosure.

Referring to FIG. 28, each of the vertical channel structures 530 may be formed in each of the channel holes 420. Each of the vertical channel structures 530 may include a memory layer 531, a channel layer 532, and a filler 533. The memory layer 531, the channel layer 532, and the filler 533 may be sequentially formed on the sidewall 520S of each of the channel holes 520. The memory layer 531 may be formed to cover the sidewall 530S of the channel hole 520. The memory layer 531 may be a layer that traps electric charges to store data. The memory layer 531 may include a tunneling layer 531-3 through which electric charges tunnel, a charge trap layer 531-2 for trapping electric charges, and a charge blocking layer 531-1 for blocking the movement of electric charges. The tunneling layer 531-3 may be located between the charge trap layer 531-2 and the channel layer 532. The tunneling layer 531-3 may include silicon oxide. The charge trap layer 531-2 may include silicon nitride. The charge blocking layer 531-1 may include silicon oxide. The memory layer 531 may include a multilayer structure of silicon oxide-silicon nitride-silicon oxide. The memory layer 531 may be formed as a layer of a material capable of storing data, such as a phase change material, nano dots, or a ferroelectric material.

The channel layer 532 may include a semiconductor material including silicon (Si). Each of the cannel layer 532 and the memory layer 531 may be formed to have a thickness that is thinner than that of the filler 533, and thus, each of the channel holes 520 might not be completely filled with only the channel layer 532 and memory layer 531. The filler 533 may be formed to completely fill the channel holes 520. The filler 533 may include an insulating material such as silicon oxide.

Figure 29:
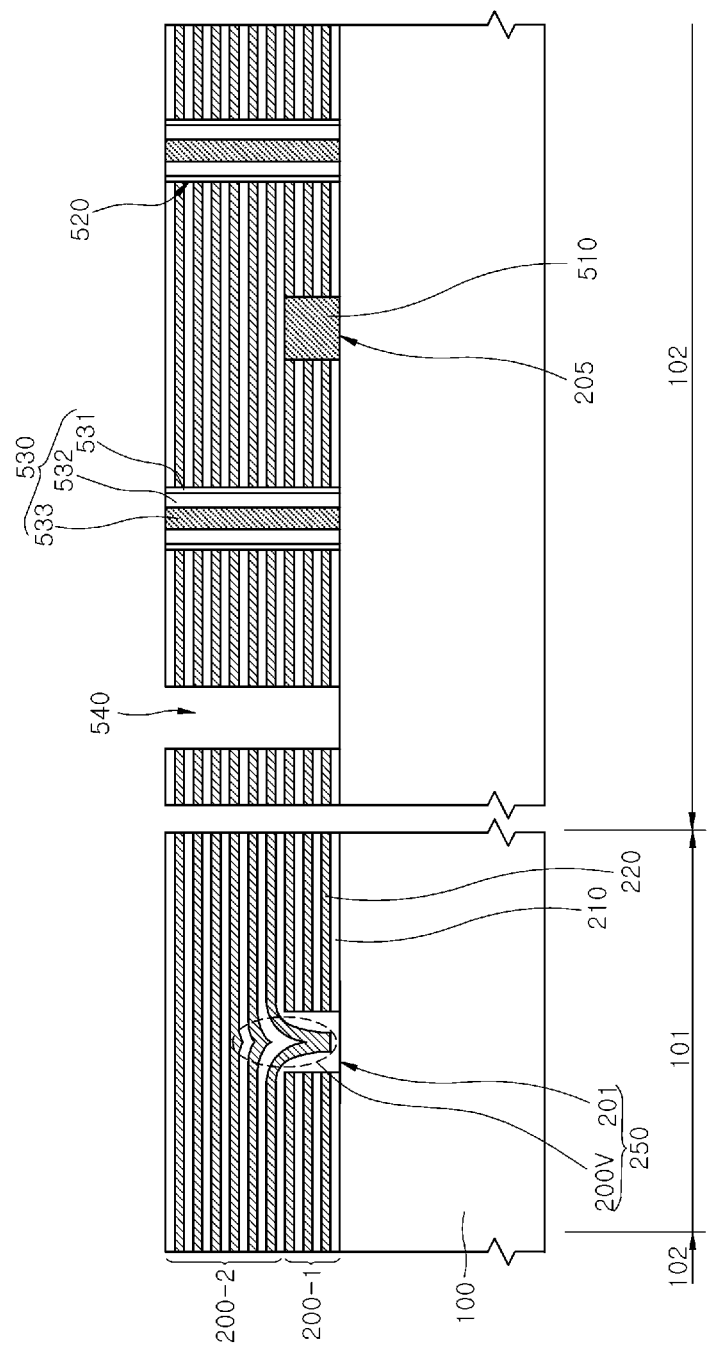

FIG. 29 is a schematic cross-sectional view illustrating a step of forming a slit 540 in a method of manufacturing a semiconductor chip according to an embodiment of the present disclosure.

Referring to FIG. 29, the slit 540 may be formed to vertically penetrate the second stack 200-2 and the first stack 200-1. The slit 540 may be formed in the shape of a trench extending long in a direction. The slit 540 may be formed to divide the layer stacks 200-1 and 200-2 into the blocks including vertical channel structures 530. The slit 540 may be formed to be located between the vertical channel structures 530. The slit 540 may be located on the chip region 102 of the semiconductor substrate 100.

Figure 30:
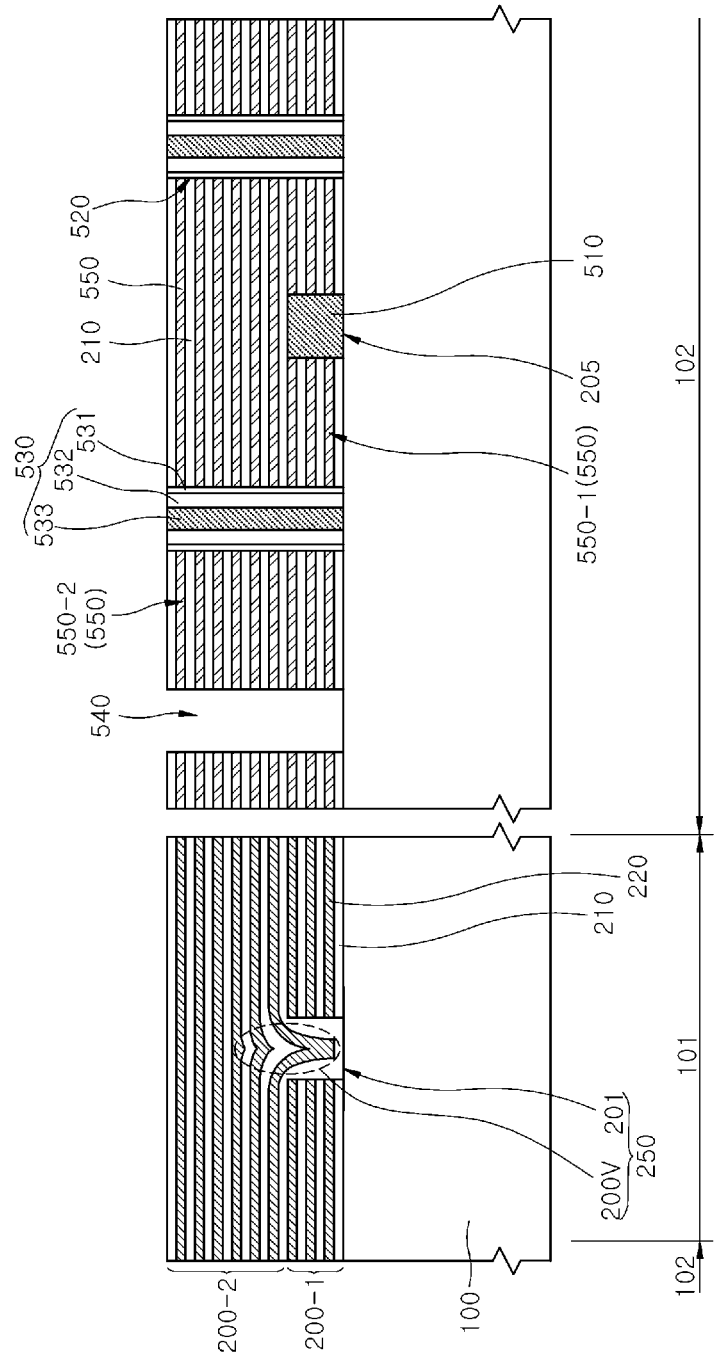

FIG. 30 is a schematic cross-sectional view illustrating a step of forming conductive layers 550 in a method of manufacturing a semiconductor chip according to an embodiment of the present disclosure.

Referring to FIG. 30, together with FIG. 29, some portions of the second material layers 220 of the first and second stacks 200-1 and 200-2 may be replaced with the conductive layers 550. The portions of the second material layers 220 located over the chip region 102 of the semiconductor substrate 100 may be replaced with the conductive layers 550. Other portions of the second material layers 220 located over the scribe lane region 101 of the semiconductor substrate 100 may be maintained as the second material layer 220.

As the slit 540 is formed, the side surfaces of the second material layers 220 of the first and second stacks 200-1 and 200-2 may be exposed to the side surface of the slit 540. The overlapped portions of the second material layers 220 over the chip region 102 may be selectively etched and removed through the slit 540. The slit 540 may be used as a path through which the portions of the second material layers 220 are selectively removed. Other portions of the second material layers 220 located over the scribe lane region 101 may be maintained without being etched. An insulating layer (not shown) for separating the scribe lane region 101 and the chip region 102 may be formed so that the portions of the second material layers 220 located over the scribe lane region 101 may be maintained without being etched.

The conductive layers 550 may be formed to fill the spaces formed by removing the portions of the second material layers 220. Each of the conductive layers 550 may include a metal material such as tungsten (W) or doped polycrystalline silicon.

The structures including the memory layer 531 and the channel layer 532 of the vertical channel structure 530 and the conductive layers 550 may constitute memory cell structures. The memory cell structures may constitute a three-dimensional NAND flash memory device. The structures including the memory layer 531 and the channel layer 532 of the vertical channel structure 530 and the conductive layers 550 may constitute a string structure of the NAND flash memory device that is vertically formed on the semiconductor substrate 100. Each of the conductive layers 550 may be used as a gate electrode or a word line with respect to the channel layer 532. Some conductive layers 550-1 located inside the first stack 200-1 may be used as source select lines (SSL) in the string structure of the NAND flash memory device. The insulating pattern 510 may be used as a separation pattern for separating the conductive layers 550-1 used as the source selection lines from each other. Some conductive layers 550-2 in the second stack 200-2 may be used as drain select lines (DSL).

Meanwhile, a peripheral circuit portion (not shown) may be disposed between the semiconductor substrate 100 and the first stack 200-1. The peripheral circuit portion may include peripheral circuits for controlling the memory cells formed over the semiconductor substrate 100. The peripheral circuit portion may be formed in a peri under cell (PUC) structure located below a cell.

Figure 31:
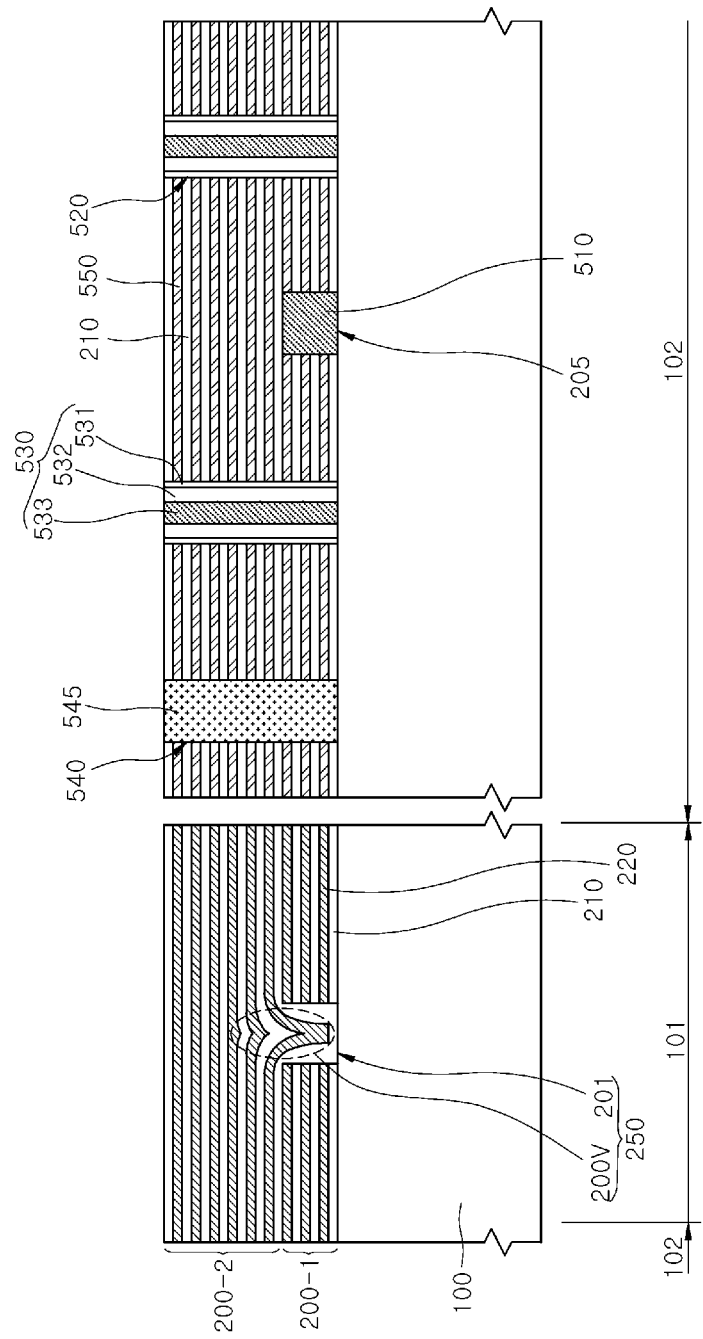

FIG. 31 is a schematic cross-sectional view illustrating a step of forming a slit pattern 545 in a method of manufacturing a semiconductor chip according to an embodiment of the present disclosure.

Referring to FIG. 31, the slit pattern 545 may be formed to fill the slit 540. The slit pattern 545 may include an insulating material such as silicon oxide.

Figure 32:
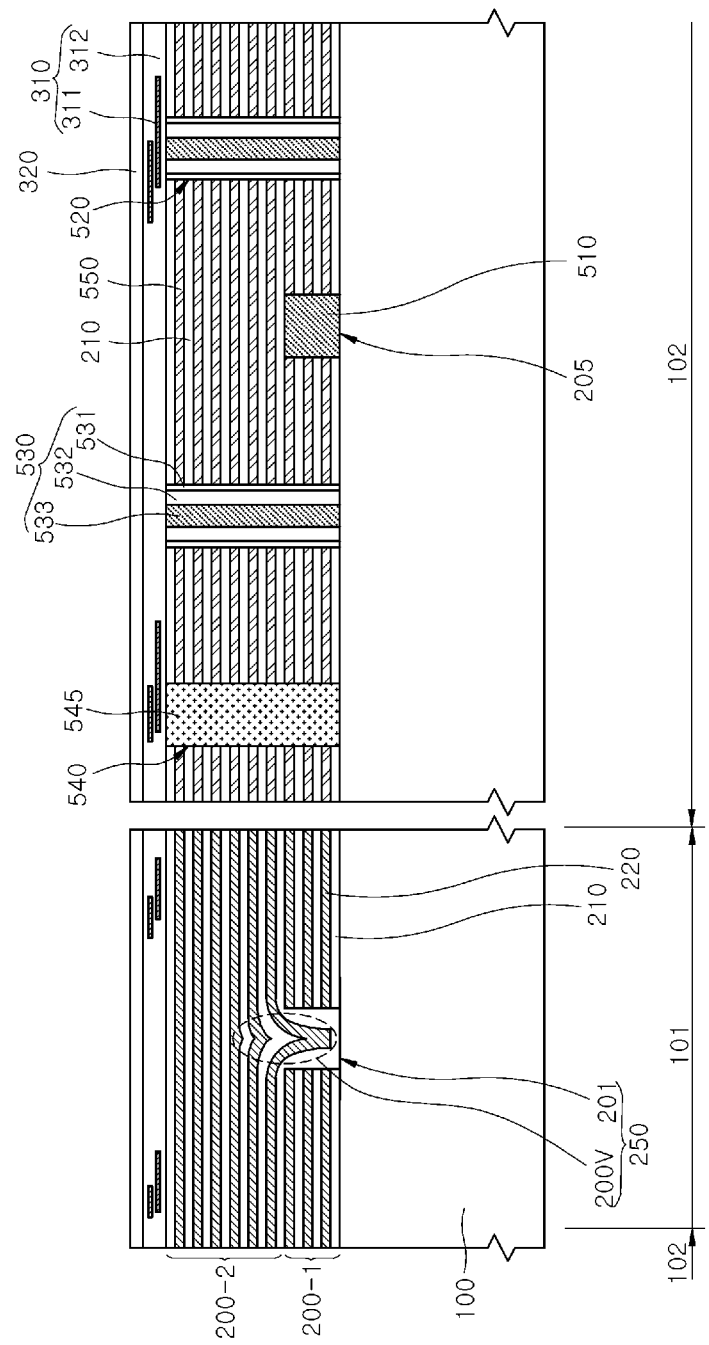

FIG. 32 is a schematic cross-sectional view illustrating a step of forming a multilayer interconnection structure layer 310 and a passivation layer 320 in a method of manufacturing a semiconductor chip according to an embodiment of the present disclosure.

Referring to FIG. 32, the multilayer interconnection structure layer 310 and the passivation layer 320 may be formed on the second stack 200-2. The multilayer interconnection structure layer 310 may be formed as a structure including a plurality of conductive patterns 311 and a plurality of insulating layers 312. The conductive patterns 311 may be electrically connected to the conductive layers 500 or may be electrically connected to the channel layer 531. The passivation layer 320 may include silicon nitride.

Figure 33:
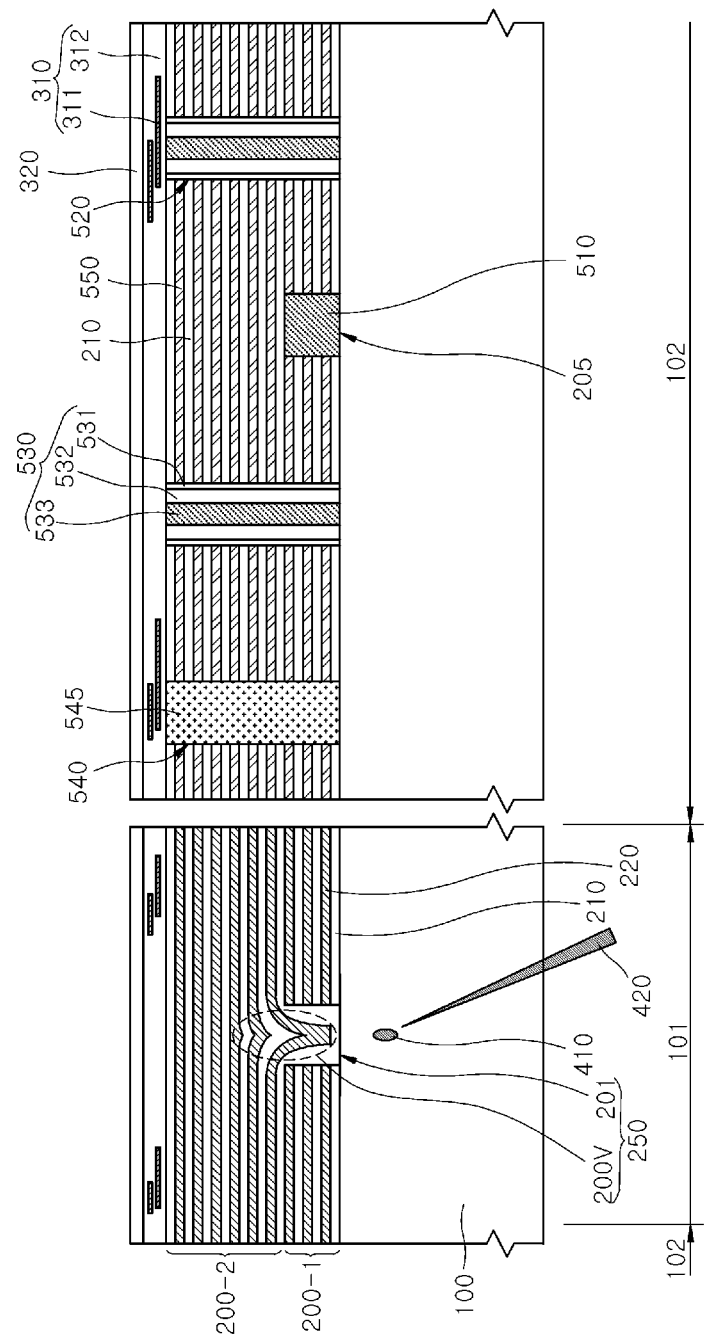

FIG. 33 is a schematic cross-sectional view illustrating a step of forming a modified pattern 410 in a method of manufacturing a semiconductor chip according to an embodiment of the present disclosure.

Referring to FIG. 33, in order to dice the semiconductor substrate 100, a dicing process using a laser, for example, a stealth dicing process may be performed. The modified pattern 410 may be formed in a portion of the semiconductor substrate 100 in the scribe lane region 101. The modified pattern 410 may be formed in the semiconductor substrate 100 by irradiating a laser 420 while focusing the laser on the position of the modified pattern 410 in the semiconductor substrate 100.

Thereafter, as described with reference to FIG. 9, the thickness of the semiconductor substrate 100 may be reduced by performing a back-grinding process. As described with reference to FIG. 11, the semiconductor substrate 100 may be diced into semiconductor chips by propagating cracks (430 of FIG. 11).

Figure 34:
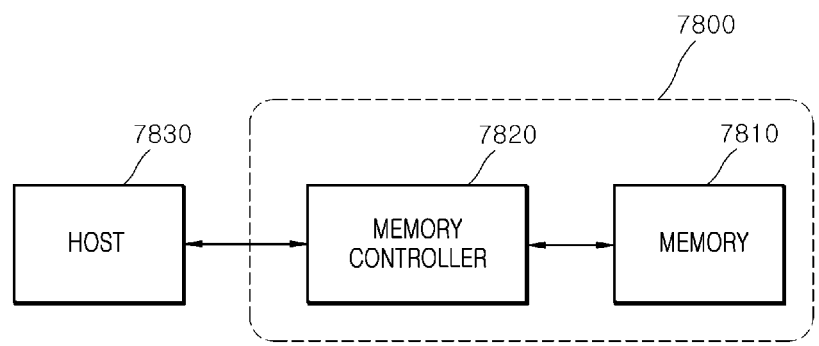
FIG. 34 is a block diagram illustrating an electronic system employing memory card including a semiconductor device according to an embodiment of the present disclosure.

FIG. 34 is a block diagram illustrating an electronic system including a memory card 7800 employing at least one of the semiconductor devices according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 35:
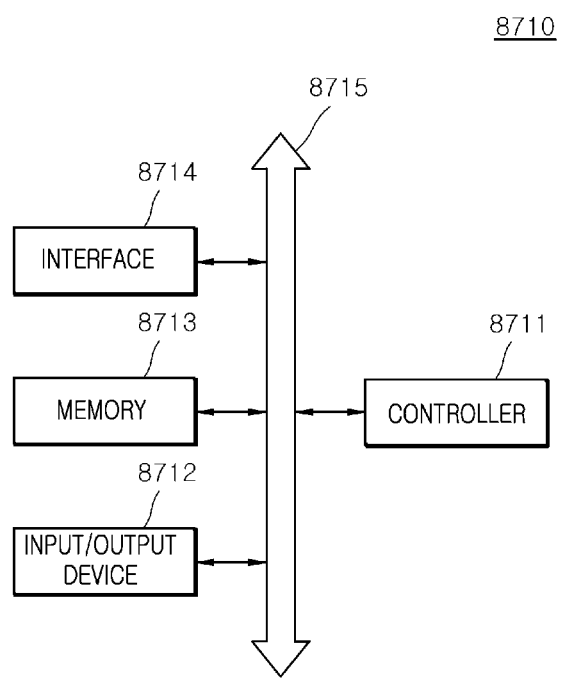
FIG. 35 is a block diagram illustrating an electronic system including a semiconductor device according to an embodiment of the present disclosure.

FIG. 35 is a block diagram illustrating an electronic system 8710 including at least one of the semiconductor devices according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scopes of the concepts are not limited to the above descriptions but defined by the accompanying claims, and all of distinctive features in the equivalent scope should be construed as being included in the concepts.

What is claimed is:

1. A method of manufacturing a semiconductor chip, the method comprising:
    forming a first stack by alternately stacking first material layers and second material layers over a semiconductor substrate;
    forming a first trench penetrating the first stack; and
    forming a first stress concentration portion by forming a second stack over the first stack, the first stress concentration portion comprises the first trench and a bent portion of the second stack.

2. The method of claim 1, wherein the bent portion of the second stack is bent into the first trench.

3. The method of claim 1, further comprising:
    forming a modified pattern in the semiconductor substrate; and
    propagating from the modified pattern a crack, the crack penetrating the semiconductor substrate and the first and second stacks.

4. The method of claim 3, wherein at least a portion of the modified pattern overlaps with at least a portion of the first stress concentration portion.

5. The method of claim 3, wherein the first stress concentration portion guides the crack to propagate in a direction crossing the semiconductor substrate.

6. The method of claim 3, wherein the crack propagates in a direction crossing the first stress concentration portion.

7. The method of claim 3, wherein forming the modified pattern includes irradiating a laser while focusing the laser on a position where the modified pattern is to be formed in the semiconductor substrate.

8. The method of claim 3, wherein forming the modified pattern further includes forming a plurality of additional modified patterns that are sequentially spaced apart from each other along a direction in which the trench extends.

9. The method of claim 3, further comprising reducing a thickness of the semiconductor substrate by back-grinding the semiconductor substrate before propagating the crack.

10. The method of claim 1, wherein forming the second stack further includes alternately stacking additional first material layers and second material layers over the first stack.

11. The method of claim 1, further comprising forming a second stress concentration portion over the second stack.

12. The method of claim 11, wherein the second stress concentration portion is formed to at least partially overlap with the first stress concentration portion.

13. The method of claim 11, wherein forming the second stress concentration portion includes:
forming a third layer stack over the second stack;
forming a second trench penetrating the third layer stack; and
forming the second stress concentration portion by forming a fourth layer stack over the third layer stack, the second stress concentration portion includes a bent portion of the fourth layer stack and the second trench, wherein the bent portion of the fourth layer stack extends and is bent into the second trench.

14. The method of claim 1, further comprising forming a spacer on a sidewall of the first trench.

15. The method of claim 14, wherein the spacer includes metal different from materials constituting the first and second material layers.

16. The method of claim 1, wherein the first material layer includes silicon oxide, and the second material layer includes silicon nitride.

17. A method of manufacturing a semiconductor chip, the method comprising:
forming a first stack by alternately stacking first material layers and second material layers over a semiconductor substrate, the semiconductor substrate including a scribe lane region and a chip region;
forming first and third trenches penetrating the first stack, the first trench being formed to overlap the scribe lane region of the semiconductor substrate and the third trench being formed to overlap the chip region of the semiconductor substrate;
forming an insulating pattern filling the third trench; and
forming a second stack over the first stack,
wherein as the second stack is formed, forming a first stress concentration portion, the first stress concentration portion comprises the first trench and a bent portion of the second stack.

18. The method of claim 17, where the bent portion of the second stack is bent into the first trench.

19. The method of claim 17, further comprising:
forming a modified pattern in the scribe lane region of the semiconductor substrate; and
propagating from the modified pattern a crack, the crack penetrating the semiconductor substrate and the first and second stacks.

20. The method of claim 19, wherein forming the modified pattern includes irradiating a laser while focusing the laser on a position where the modified pattern is to be formed in the semiconductor substrate.

21. The method of claim 19, further comprising reducing a thickness of the semiconductor substrate by back-grinding the semiconductor substrate before propagating the crack.

22. The method of claim 17, further comprising:
forming a channel hole penetrating the first and second stacks and overlapping with the chip region; and
forming a memory layer and a channel layer over a sidewall of the channel hole.

23. The method of claim 22, wherein the memory layer includes a charge tunneling layer, a charge trap layer, and a charge blocking layer, and
wherein the channel layer includes a semiconductor material.

24. The method of claim 17, wherein forming the second stack further includes alternately stacking additional first material layers and second material layers over the first stack.

25. The method of claim 24, further comprising:
selectively removing portions of the second material layers overlapping with the chip region of the semiconductor substrate; and
filling a portion generated by removing the portions of the second material layers with a conductive layer.

* * * * *